(12) United States Patent
Yasukawa

(10) Patent No.: US 6,232,142 B1
(45) Date of Patent: May 15, 2001

(54) SEMICONDUCTOR DEVICE AND METHOD FOR MAKING THE SAME, ELECTRO-OPTICAL DEVICE USING THE SAME AND METHOD FOR MAKING THE ELECTRO-OPTICAL DEVICE, AND ELECTRONIC APPARATUS USING THE ELECTRO-OPTICAL DEVICE

(75) Inventor: Masahiro Yasukawa, Chimo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/355,777

(22) PCT Filed: Dec. 4, 1998

(86) PCT No.: PCT/JP98/05525

§ 371 Date: Aug. 3, 1999

§ 102(e) Date: Aug. 3, 1999

(87) PCT Pub. No.: WO99/30370

PCT Pub. Date: Jun. 17, 1999

(30) Foreign Application Priority Data

Dec. 9, 1997 (JP) .................................... 9-339199

(51) Int. Cl.$^7$ ............................. H01L 21/00; H01L 27/00
(52) U.S. Cl. ........................... 438/69; 438/116; 438/659; 257/82
(58) Field of Search .............................. 438/659, 69, 116, 438/459; 251/82

(56) References Cited

U.S. PATENT DOCUMENTS 5,374,564  12/1994  Bruel .

FOREIGN PATENT DOCUMENTS

| | | | |
|---|---|---|---|
| 2284070 | * 8/1997 | (GB) | ................................ G03F/1/00 |
| 1-131593 | 5/1989 | (JP) . | |
| 4-133033 | 5/1992 | (JP) . | |
| 4-152574 | 5/1992 | (JP) . | |
| 4-346418 | 12/1992 | (JP) . | |
| 5-136170 | 6/1993 | (JP) . | |
| 6-75244 | 3/1994 | (JP) . | |
| 8-46160 | 2/1996 | (JP) . | |
| 8-316443 | 11/1996 | (JP) . | |
| 09082639 | * 3/1997 | (JP) | ............................... H01L/21/20 |
| 9-223783 | 8/1997 | (JP) . | |

OTHER PUBLICATIONS

IBM Technical Paper NN 7802371 Feb. 1978.*

* cited by examiner

*Primary Examiner*—Chandra Chaudhari
*Assistant Examiner*—David S. Blum
(74) *Attorney, Agent, or Firm*—Oliff & Berridge, PLC

(57) ABSTRACT

In production of a semiconductor device using an SOI technology by an adhesion method, a thin film with high thermal conductivity is formed between an insulating supporting substrate and a single-crystal silicon film formed thereon to enhance uniformity of a thermal distribution. The single-crystal silicon film is subjected to thermal treatment to improve uniformity of the thermal distribution and to enhance the adhesion strength during an adhesion step. When a peripheral circuit provided with switching elements showing a large amount of heat generation is formed of semiconductor devices having a thin film with high thermal conductivity to enhance the heat-dissipating function, temperature rise during the operation is suppressed. When the thin film with high thermal conductivity is composed of a light-shielding material, the light-shielding function is also improved. Accordingly, temperature rise and deterioration of the characteristics of the switching element due to incident light can be suppressed.

33 Claims, 13 Drawing Sheets

SEMICONDUCTOR DEVICE AND METHOD FOR MAKING THE SAME, ELECTRO-OPTICAL DEVICE USING THE SAME AND METHOD FOR MAKING THE ELECTRO-OPTICAL DEVICE, AND ELECTRONIC APPARATUS USING THE ELECTRO-OPTICAL DEVICE

BACKGROUND OF THE INVENTION

1. Field of the Invention

The present invention relates to a technical field of semiconductor devices and methods for making the same. In particular, the present invention relates to a technical field of a method for making a semiconductor device including forming a single-crystal semiconductor thin film for constituting switching elements such as thin film transistors (hereinafter referred to as TFTs) on an insulating substrate, a semiconductor device produced by this method, a method for making an electro-optical device using the semiconductor device, an electro-optical device produced by this method, and an electronic apparatus using the electro-optical device.

2. Description of Related Art

Semiconductor technologies for forming a single-crystal silicon thin film on an insulating substrate and for forming semiconductor devices using the single-crystal silicon thin film are called silicon-on-insulator (SOI) technologies and have been widely studied because of their advantages, such as high-speed response, low electrical power consumption, and high integration density of pixels.

One of the SOI technologies is an SOI substrate production technology by adhesion of a single-crystal silicon substrate. This method, generally called an "adhesion process", includes adhering a single-crystal silicon substrate to a supporting substrate (an insulating substrate) by a hydrogen bonding force, reinforcing the adhering strength by heat treatment, and then thinning the single-crystal silicon substrate by grinding, polishing, or etching to form a single-crystal silicon layer on the supporting substrate. This process can directly thin the single-crystal silicon substrate and enables production of high-performance devices with silicon thin films having high crystallinity.

Applied methods of this adhering process have also been known, for example, a method including implantation of hydrogen ions into a single-crystal silicon substrate, adhering this substrate to a supporting substrate, and then separating a thin film silicon layer from a hydrogen-implanted region of the single-crystal silicon substrate by heat treatment (U.S. Pat. No. 5,374,564), and a method for forming an epitaxial single-crystal silicon thin film on a supporting substrate which includes epitaxial growth of a single-crystal silicon layer on the silicon substrate with a porous surface, adhering this substrate to a supporting substrate, removing the silicon substrate, and then etching the porous silicon layer (Japanese Patent Laid-Open Application No. 4-346418).

SOI substrates formed by the adhesion methods have been used in production of various devices, as well as general bulk semiconductor substrates (semiconductor integrated circuits), and have an advantage in which various materials can be used as a supporting substrate different from an advantage of the conventional bulk substrate. Transparent quartz and glass substrates, in addition to general silicon substrates, can be used as supporting substrates. As a result, for example, formation of a single-crystal silicon thin film on a transparent substrate enables formation of high-performance transistor elements using single-crystal silicon having high crystallinity in devices requiring light transmissivity, such as electro-optical devices such as a transmissive liquid crystal display device.

SUMMARY OF THE INVENTION

According to production methods using SOI technologies by the above-mentioned adhering processes, by adhering a light-transmissive transparent supporting substrate with a single-crystal silicon thin film in SOI substrates, and particularly, an SOI substrate using glass including quartz as a supporting substrate, thermal conductivity of the quartz glass substrate will cause a problem during adhesion. For example, the thermal conductivity of quartz glass is in a range of 1 to 2 W/m·K and is two orders of magnitude lower than that of the single-crystal silicon substrate, hence, thermal distribution on the adhering face differs between the periphery and the center. Such a nonuniform thermal distribution on the adhering face produces a nonuniform bonding force distribution on the adhering face, and thus causes voids and defects on the adhering face.

When the method described in U.S. Pat. No. 5,374,564 is applied to a quartz glass substrate in which hydrogen ions are implanted into a single-crystal silicon substrate, which is adhered to the supporting substrate, and then a thin film silicon layer, is separated from the hydrogen-implanted region of the single-crystal silicon substrate, the thermal distribution in the hydrogen-implanted region becomes nonuniform during the substrate separation step, and the single-crystal silicon substrate will not be separated from the single-crystal silicon film in a partial region.

On the other hand, a semiconductor device produced by the above-mentioned method has a problem in that heat generated during the operation thereof is not adequately dissipated from the use of a supporting substrate having low thermal conductivity. When the semiconductor devices produced in such a method are used as switching elements in the pixel section or peripheral circuit section of an electro-optical device, such as a liquid crystal device, the temperature of the switching elements increases during the operation due to insufficient heat dissipation, resulting in some problems, including deterioration of switching element characteristics.

In such electro-optical devices, temperature rise is also caused by projected light which is incident on the electro-optical device (among the light emitted from a light source or the like), and reflected light (reflected by succeeding optical elements among the light emitted from the electro-optical device), as well as heating of the semiconductor device itself, hence, the above-described insufficient heat dissipation during the operation will become a more serious problem when it is used in a projector using intense projected light.

It is an object of the present invention, achieved in view of the above-described problems, to provide a method for making a semiconductor device having a highly uniform in-plane thermal distribution during the production process, a semiconductor device produced by this method, and high heat-dissipation characteristics during operation, and an electro-optical device, such as a liquid crystal device and an electronic apparatus, using the semiconductor device.

The object of the present invention is achieved by a method for making a semiconductor device including the steps of forming a thermally conductive film having thermal conductivity which is higher than that of the supporting substrate on one surface of the supporting substrate, forming a first insulating film on the thermally conductive film, and adhering a single-crystal semiconductor film onto the first insulating film by heat treatment.

According to the method for making a semiconductor device of the present invention, a thermally conductive film is first formed on one surface of a supporting substrate, and then a first insulating film is formed on the thermally conductive film. A single-crystal semiconductor film is formed on the first insulating film by heat treatment to produce a semiconductor device using an SOI technology by an adhesion method. Since the thermally conductive film is disposed between the first insulating film and the supporting substrate, the thermally conductive film conducts heat during the heat treatment in the adhesion step and the thermal distribution is made uniform in the substrate plane. Since the uniformity of the thermal distribution on the substrate plane by the heat treatment is high during the adhesion step, enhancement of the adhesion strength is achieved together with the uniformity of the adhesion in the substrate plane, and defects and deterioration of a semiconductor device which will be finally produced can be decreased. Even when a supporting substrate having a relatively large area is used, a semiconductor device showing high performance and stable reliability and quality can be produced with relatively high production yield and productivity, since it has a single-crystal film having significantly high crystallinity like that of a single crystal.

In the semiconductor device produced by the method in accordance with the present invention, a thermally conductive film is provided opposite to the single-crystal semiconductor film separated by the first insulating film therebetween, hence, the thermally conductive film can dissipate heat generated in the single-crystal semiconductive film. Such enhancement of heat dissipation during the operation of the semiconductor device facilitates the normal operation of the semiconductor device while controlling the operational temperature within a predetermined range when it is used in large electrical power drive or high frequency drive, which generates a large amount of heat during the operation. Accordingly, the method in accordance with the present invention enables production of a semiconductor device with high reliability which does not cause deterioration of device characteristics and can normally operate under a large current driving or high frequency driving condition.

In an embodiment of the method for making a semiconductor device in accordance with the present invention, the supporting substrate may consist of a light-transmissive material.

According to this embodiment, since the supporting substrate is composed of a light-transmissive material, the semiconductor device can be formed on the light-transmissive supporting substrate using a single-crystal semiconductor film, unlike the case using a conventional single-crystal silicon substrate. Wider use of the semiconductor device of the present invention can be made, for example, in the production of various electro-optical devices in which predetermined regions of the supporting substrate transmit light and semiconductor devices are disposed in the other regions.

In this embodiment, the light-transmissive material may be composed of glass.

Since the light-transmissive supporting substrate is composed of glass in such production, the semiconductor device in accordance with the present invention is applicable to relatively inexpensive general optical devices such as a liquid crystal panel.

In this case, the glass may be a quartz glass.

In such a configuration, the supporting substrate is composed of a quartz glass, hence, heat resistance of the supporting substrate is enhanced. Thus, heat treatment of a single-crystal semiconductor film and a high-temperature process after adhering of the single-crystal semiconductor film are allowed. Characteristics of a semiconductor device, for example, a thin film transistor, formed using a single-crystal semiconductor film can be improved by heat treatment, and a high-performance semiconductor device can be produced using a high temperature process such as formation of a thermal oxide film or high temperature annealing.

In another embodiment of the method for making the semiconductor device of the present invention, the single-crystal semiconductor film may consist of silicon.

According to this embodiment, since the single-crystal semiconductor film is a single-crystal silicon film composed of silicon, for example, silicon transistors having excellent transistor characteristics can be produced by forming channel regions of the transistors in the single-crystal silicon film. A single-crystal germanium film or the like may be used instead of the single-crystal silicon film.

In another embodiment of the method for making the semiconductor device of the present invention, the step for adhesion of the single-crystal semiconductor film is performed by heat treatment in an oxygen-containing atmosphere.

According to this embodiment, the heat treatment in the oxygen-containing atmosphere in the step for adhesion of the single-crystal semiconductor film facilitates bonding by thermal oxidation of the adhering surface, and thus the supporting substrate comes into tight contact with the single-crystal semiconductor substrate at the adhering surface. Although the heat treatment may be performed in an atmosphere containing argon or nitrogen or the like, other than the oxygen-containing atmosphere, the heat treatment in the oxygen-containing atmosphere can produce an adhering surface having tight contact relatively easily.

In another embodiment of the method for making the semiconductor device of the present invention, the thermally conductive film may consist of a light-shielding material.

According to this embodiment, since the semiconductor device produced has a thermally conductive film composed of a light-shielding material disposed opposite to the single-crystal semiconductor film separated by the first insulating film therebetween, the thermally conductive film can shield the single-crystal semiconductor film from the incident light, such as the projection light and the reflected light from the supporting substrate side. Such enhancement of the light-shielding function during the operation of the semiconductor device permits suppression of temperature rise in the semiconductor device of strong incident light such as projection light, in addition to heating of the device itself. Furthermore, optical leakage of the incident light by the photoelectric effect in the single-crystal semiconductor film during the operation in the semiconductor device can be effectively prevented.

In another embodiment of the method for making the semiconductor device of the present invention, the thermally conductive film may consist of a high melting point metal.

According to this embodiment, the thermally conductive film is composed of a single metal substance, an alloy or a metal silicide, which contains a high melting point metal, for example, at least one of titanium (Ti), chromium (Cr), tungsten (W), tantalum (Ta), molybdenum (Mo), and lead (Pb). Since the melting point of the thermally conductive film is increased, the thermally conductive film is prevented from melting, deformation, or rupture during a high temperature process in the production of the semiconductor device using a single-crystal semiconductor film formed thereon. Since it is formed of a high melting point metal, it has high thermal conductivity easily.

In another embodiment of the method for making the semiconductor film of the present invention, the thermally conductive film may consist of silicon.

According to this embodiment, the thermally conductive film contains silicon and is composed of, for example, pure silicon, an alloy thereof, or a metal silicide. Silicon is durable in the heat treatment step in the production of the semiconductor device using a single-crystal semiconductor film formed thereon. Silicon improves adhesion to the substrate and thus the production yield and reliability of the device.

In another embodiment of the method for making the semiconductor device of the present invention, the method further includes the step of forming a second insulating film between the thermally conductive film and the supporting substrate.

According to this embodiment, since the second insulating film is formed between the thermally conductive film and the supporting substrate, the adhesion between the supporting substrate composed of a different substance and the thermally conductive film can be improved in total when the second insulating film is formed of a material having high adhesion ability to both the supporting substrate and the thermally conductive film. Thus, the production yield and the reliability of the device can be improved.

In this embodiment, the second insulating film may contain at least one of a silicon oxide film, a silicon nitride film, and a tantalum oxide film.

In such a configuration, the second insulating film composed of, for example, a silicon oxide film or an alloy thereof, a silicon nitride film or an alloy thereof, or a tantalum oxide film or an alloy thereof satisfactorily functions as an underlying insulating film for enhancing the adhesion between the supporting substrate and the thermally conductive film, and promotes uniformity of the thermal distribution in the substrate plane.

In another embodiment of the method for making the semiconductor device of the present invention, the method further includes the step of planarizing the first insulating film after the step for forming the first insulating film.

According to this embodiment, since the first insulating film is planarized after the formation of the first insulating film, irregularity (or mohology) on the surface of the single-crystal semiconductor film adhered to the first insulating film in the succeeding step for adhesion of the single-crystal semiconductor film is improved. Thus, a semiconductor film with high performance and high reliability can be ultimately produced.

In this embodiment, the step for planarizing the first insulating film may include a step for planarizing by a chemomechanical polishing (CMP) treatment of the first insulating film.

Such planarization allows planarization in the order of nanometers by the CMP treatment and also significantly reduces irregularity on the surface of the single-crystal semiconductor film adhered to the first insulating film.

In another embodiment of the method for making the semiconductor device of the present invention, the method further includes the step of thinning the first insulating film after the step of forming the first insulating film.

According to this embodiment, since the first insulating film is thinned after the formation thereof, heat transfer between the single-crystal semiconductor film and the thermally conductive film is easily achieved after the thinning, depending on the thinness. Thus, the thermally conductive film further promotes uniformity of the thermal distribution in the substrate plane. Furthermore, in the operation of the semiconductor device produced by the present invention, heat transfer between the single-crystal semiconductor film and the thermally conductive film is facilitated, hence, the heat-dissipating function of the thermally conductive film can be further improved. In addition, when the first insulating film is used as a dielectric film to form a capacitor, a large capacitance is achieved depending on the thinness of the first insulating film.

In this embodiment, the step for thinning the first insulating film may include the step for thinning the first insulating film by CMP treatment.

Such thinning by the CMP treatment enables planarization in the order of nanometers, and irregularities formed on the surface of the single-crystal semiconductor film adhered to the first insulating film are also reduced.

In the embodiment including the step for thinning, the first insulating film may be thinned until the thickness reaches 300 nm or less.

Thinning to such an extent significantly promotes uniformity of the thermal distribution in the substrate plane using the thermally conductive film during the production process, and significantly improves the heat-dissipating function of the thermally conductive film during the operation of the semiconductor device produced. In addition, when the first insulating film is used as a dielectric film to form a capacitor, a large capacitance can be relatively easily formed.

In another embodiment of the method for making the semiconductor device of the present invention, the first insulating film may consist of a silicon-containing alloy.

According to this embodiment, since the first insulating film is composed of a silicon-containing alloy (for example, silicon oxide or a metal silicide), thermal conduction through the first insulating film is relatively satisfactorily achieved and the above-mentioned effects by the thermally conductive film are noticeable. In particular, the planarization treatment and thinning treatment can be relatively easily applied to the first insulating film.

In another embodiment of the method for making the semiconductor device of the present invention, the method further includes the step of forming a third insulating film on the surface of the single-crystal semiconductor film prior to the step of adhering the single-crystal semiconductor film onto the first insulating film.

According to this embodiment, since the third insulating film is formed on the surface of the single-crystal semiconductor film prior to adhering the single-crystal semiconductor film, the single-crystal semiconductor film is adhered to the first insulating film with the third insulating film provided therebetween. As a result, when the side which is not adjacent to the third insulating film of the single-crystal semiconductor film is peeled off after the adhering, only the thin film section of the single-crystal semiconductor film adjacent to the third insulating film can remain so that it is adhered to the first insulating film together with the third insulating film. The thermal distribution in the substrate plane is made uniform by the presence of the thermally conductive film to avoid local non-peeling of the single-crystal semiconductor film, and thus the thin film section can be satisfactorily peeled off. Alternatively, removing the side which is not adjacent to the third insulating film of the single-crystal semiconductor film by polishing or etching or the like after adhesion can allow the thin film section of the single-crystal semiconductor film adjacent to the third insulating film with the third insulating film to remain on the first insulating film. The thermally conductive film facilitates uniformity of the thermal distribution in the substrate plane and the thin film section can remain on the first insulating film.

In this embodiment, the third insulating film may be formed by oxidizing or nitriding the surface of the single-crystal semiconductor film in the step for forming the third insulating film.

Such formation of the third insulating film facilitates formation of a thin third insulating film having tight adhesion characteristics on the surface of the single-crystal semiconductor film.

The above-mentioned object of the present invention is achieved by a semiconductor device constituting at least a part of a peripheral circuit provided in the peripheral region of a supporting substrate, which may consist of a thermally conductive film formed on at least one surface of the supporting substrate in at least the peripheral region and having thermal conductivity higher than that of the supporting substrate, a first insulating film formed on the thermally conductive film, and a single-crystal semiconductor film adhered onto the first insulating film and functioning as a current path of the peripheral circuit.

According to the semiconductor device of the present invention, a thermally conductive film is disposed opposite to a single-crystal semiconductor film with a first insulating film provided therebetween. Thus, the thermally conductive film can dissipate heat generated by a current flowing in the single-crystal semiconductor film as a current path during the operation thereof. Such enhancement of the heat-dissipating function during operation enables normal operation while controlling the operational temperature within a predetermined range when the device is used for large electrical power drive or high frequency drive generating a large amount of heat. Thus, the semiconductor device of the present invention can be formed on a supporting substrate with a relatively large area and has a single-crystal film having crystallinity which is as high as that of a single-crystal, hence, the semiconductor device has high reliability and can normally operate without deterioration of characteristics under conditions of high electrical power drive or high frequency drive.

In an embodiment of the semiconductor device of the present invention, the thermally conductive film may consist of a light-shielding material.

According to this embodiment, the thermally conductive film disposed opposing the single-crystal semiconductor film with the first insulating film therebetween is composed of a light-shielding material, hence, the thermally conductive film shields the single-crystal semiconductor film from incident light such as projection light and the reflected light from the supporting substrate side. Such enhancement of the light-shielding functions during operation can suppress temperature rise due to intense incident light such as projection light, as well as heating of the device itself. Furthermore, optical leakage of the incident light by the photoelectric effect in the single-crystal semiconductor film can be effectively prevented.

In another embodiment of the semiconductor device of the present invention, the semiconductor device may consist of a single-crystal thin film transistor provided with a channel region, a source region, and a drain region in the single-crystal semiconductor film.

According to this embodiment, the semiconductor device is composed of a single-crystal thin film transistor. Thus, the heat-dissipating function of the thermally conductive film in accordance with the present invention is significantly effective, since this device generates a large amount of heat when the current is on due to large electrical power drive or high frequency drive, compared to polycrystalline thin film transistors and amorphous thin film transistors having inferior transistor characteristics.

The above-mentioned object of the present invention is also achieved by a method for making an electro-optical device which may consist of an electro-optical material held between a supporting substrate and an opposite substrate, a plurality of first switching elements arranged in a matrix form corresponding to a pixel array in an image display region on the supporting substrate, and a plurality of second switching elements arranged in a peripheral region of the image display region and at least partly constituting a peripheral circuit, the method which may consist of the steps of forming a thermally conductive film having a thermal conductivity higher than that of the supporting substrate at least in a region facing the second switching elements on one surface of the supporting substrate, forming a first insulating film on the thermally conductive film, and adhering a single-crystal semiconductor film functioning as current paths in the second switching elements on the first insulating film by heat treatment.

According to the method for the electro-optical device of the present invention, the thermally conductive film is formed in a region facing at least the second switching elements by etching independently or simultaneously parts of the single-crystal semiconductor film, the first insulating film, and the thermally conductive film. Since the thermally conductive film is disposed between the first insulating film and the supporting substrate below the single-crystal semiconductor film functioning as the current paths of the second switching elements constituting the peripheral circuit (at the supporting substrate side), the thermal distribution is made uniform in the substrate plane during the heat treatment in the adhesion step. Thus, uniform adhesion on the substrate plane can be achieved to enhance the adhesion strength, reducing defects and deterioration of the second switching elements finally produced, and thus reducing defects and deterioration in the electro-optical device.

In the second switching elements in the electro-optical device produced by the method in accordance with the present invention, the thermally conductive film faces the single-crystal semiconductor film and is separated by the first insulating film, hence, the thermally conductive film can dissipate heat generated by a current flowing in the single-crystal semiconductor film as current paths of the second switching elements during operation. Such enhancement of the heat-dissipating function during the operation of the second switching elements allows normal operation of the second switching elements while controlling the operational temperature within a predetermined range when they are used with large electrical power drive or high frequency drive that generates a large amount of heat.

In an embodiment of the method for making the electro-optical device of the present invention, the thermally conductive film may consist of a light-shielding material.

According to this embodiment, the thermally conductive film facing the single-crystal semiconductor film separated by the first insulating film is composed of a light-shielding material in the semiconductor device produced; hence, the thermally conductive film can shield the single-crystal semiconductor film from incident light, such as projection light and reflected light from the supporting substrate side. Such enhancement of the light-shielding function during operation can suppress temperature rise due to intense incident light such as projection light, and due to heat from the device itself, and can effectively prevent leakage of incident light by means of the photoelectric effect in the single-crystal semiconductor film.

The above-mentioned object of the present invention is also achieved by an electro-optical device which may consist of an electro-optical material held between a supporting substrate and an opposite substrate, a plurality of first switching elements arranged in a matrix corresponding to a pixel array in an image display region on the supporting substrate, a plurality of second switching elements arranged in a peripheral region of the image display region and at least partly constituting a peripheral circuit, a thermally conductive film formed on one surface of the supporting substrate in at lest the peripheral region and having a thermal conductivity higher than that of the supporting substrate, and a first insulating film formed on the thermally conductive film, wherein the second switching elements include a single-crystal semiconductor film as current paths adhered on the first insulating film.

According to the electro-optical device of the present invention, the thermally conductive film is arranged opposing the single-crystal semiconductor film separated by the first insulating films in the second switching elements. Thus, the thermally conductive film can dissipate heat generated in the single-crystal semiconductor film as a current path by a current flowing therein during the operation of the second switching elements. Such enhancement of the heat-dissipating function during the operation of the second switching elements enables normal operation of the device while controlling the operational temperature within a pre-determined range when the device is used for large electrical power drive or high frequency drive generating a large amount of heat. Accordingly, in the electro-optical device of the present invention, the first and second switching elements can be arranged in the image display region and the peripheral region on a supporting substrate having a relatively large area. Since the device has a single crystal film having crystallinity which is comparable to that of a single crystal, the peripheral device can be formed using highly reliable second switching elements which show high performance and does not show deterioration of properties under large current driving conditions or high frequency driving conditions. Since the first switching elements are provided in the image display region, they are not subject to large current drive or high frequency drive, and unlike in the second switching elements, intensive heat dissipation from the thermally conductive film is not necessary. A thermally conductive film, however, may also be provided at a position facing the first switching elements to dissipate heat.

In an embodiment of the electro-optical device of the present invention, the first switching elements include a single-crystal semiconductor film as current paths adhered to the first insulating film in the image display region.

According to this embodiment, the first switching elements also include the single-crystal semiconductor film as current paths adhered to the first insulating film as in the second switching elements. Thus, the first and second switching elements can be formed of the same film on the same substrate, and the production process can be simplified.

In another embodiment of the electro-optical device of the present invention, the second switching elements comprise single-crystal thin film transistors provided with channel regions, source regions, and drain regions in the single-crystal semiconductor film.

According to this embodiment, the second switching elements are composed of single-crystal thin film transistors and the amount of heat generation when they are in an on state is noticeable since they are used for large electrical power drive and high frequency drive. Thus, the heat-dissipating function of the thermally conductive film of the present invention is significantly effective. The first switching elements may comprise the thin film transistors as in the second switching elements.

In another embodiment of the present invention, the peripheral circuit comprises driving circuits.

According to this embodiment, the peripheral circuit comprises driving circuits, such as a scanning line driving circuit and a data line driving circuit. The heat-dissipating function of the thermally conductive film of the present invention is significantly effective, since the second switching elements generate a large amount of heat when they are in an on state and are used for large electrical power drive or high frequency drive.

In another embodiment of the electro-optical device of the present invention, the thermally conductive film comprises a light-shielding material.

According to this embodiment, the thermally conductive film arranged opposite to the single-crystal semiconductor film separated by the first insulating film is composed of a light-shielding material, hence, the thermally conductive film can shield the single-crystal semiconductor film from incident light such as projection light and reflected light from the supporting substrate side. Such enhancement of light-shielding characteristics during operation can suppress temperature rise due to intense incident light such as projection light as well as by heating by the device itself. Furthermore, optical leakage of the incident light by the photoelectric effect in the single-crystal semiconductor film can be effectively prevented. The light-shielding film may be formed by coating on an entire region to be shielded including the peripheral region thereof, or by coating on island regions to be shielded. The single-crystal semiconductor film may also be formed as a solid region or islands.

In another embodiment of the present invention, the thermally conductive film comprises a conductive material and constitutes a wiring.

According to this embodiment, the thermally conductive film composed of a conductive material constitutes a wiring, hence, the production process can involve a wiring production step when the thermally conductive film is formed. Furthermore, the layered configuration on the supporting substrate can be simplified by using the thermally conductive film as a film constituting a wiring.

In another embodiment of the present invention, the thermally conductive film comprises a conductive material and constitutes a one-side electrode of a capacitor.

According to this embodiment, the thermally conductive film composed of a conductive material functions as a one-side electrode of a storage capacitor in each pixel in the image display region and capacitor contained in the peripheral circuit, hence, the one-side electrode can be formed concurrently in the step of forming the thermally conductive film in the production process. Furthermore, the layered configuration on the supporting substrate can be simplified by using the thermally conductive film as a film constituting a one-side electrode of the capacitors. In such a configuration, when the one-side electrode of the capacitors is formed of a thermally conductive film composed of a light-shielding material, the light-shielding function at the side of the one-side electrode is enhanced and formation of pairs of electrons and positive holes by the light incident from the exterior causing an increase in a photocurrent can be prevented.

The above-mentioned object of the present invention is also achieved by an electronic apparatus provided with the electro-optical device of the present invention.

Since the electronic apparatus of the present invention is provided with the electro-optical device of the present invention described above, the first and second switching elements can be formed in the image display region and the peripheral region on a supporting substrate having a relatively large area. Since the single crystal film has high crystallinity comparable to a single crystal, various electronic apparatuses having high reliability and displaying high quality images can be formed of a peripheral circuit using second switching elements which have a significantly higher heat-dissipating function and can operate normally under large current drive conditions or high-frequency drive conditions.

In an embodiment of the electronic apparatus of the present invention, the apparatus further includes a light source and a projection lens, wherein the thermally conductive film comprises a light-shielding material, and the electro-optical device modulates light from the light source, and the projection lens projects the light modulated by the electro-optical device.

According to this embodiment, the second switching elements have an enhanced light-shielding function in addition to an enhanced heat-dissipating function so as to suppress temperature rise due to intense incident light, such as projection light from the light source, in addition to heat generation from the first and second switching elements themselves. Leakage of incident light by the photoelectric effect in the single-crystal semiconductor film can also be effectively prevented. Accordingly, an electronic apparatus such as a projector capable of displaying a high-quality image and having high reliability can be achieved.

DETAILED DESCRIPTION OF PREFERRED EMBODIMENTS

The best mode of the present invention will now be described with reference to the embodiments and the drawings.

First Embodiment

Figure 1:
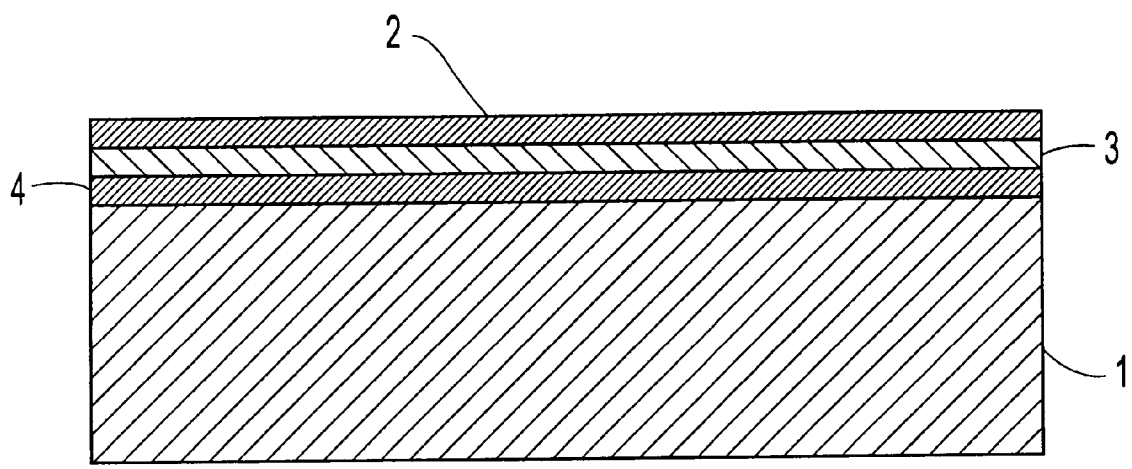
FIG. 1 is a cross-sectional view of a first embodiment of semiconductor device in accordance with the present invention.
Figure 2A:
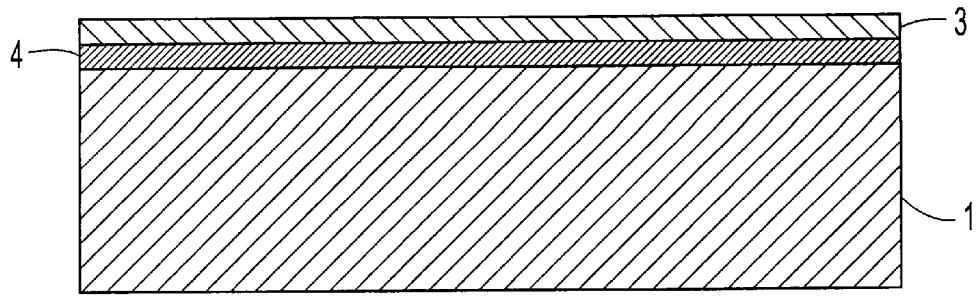
FIGS. 2(a)-(c) show production steps of a method for making the semiconductor device of the first embodiment in accordance with the present invention.
Figure 2B:
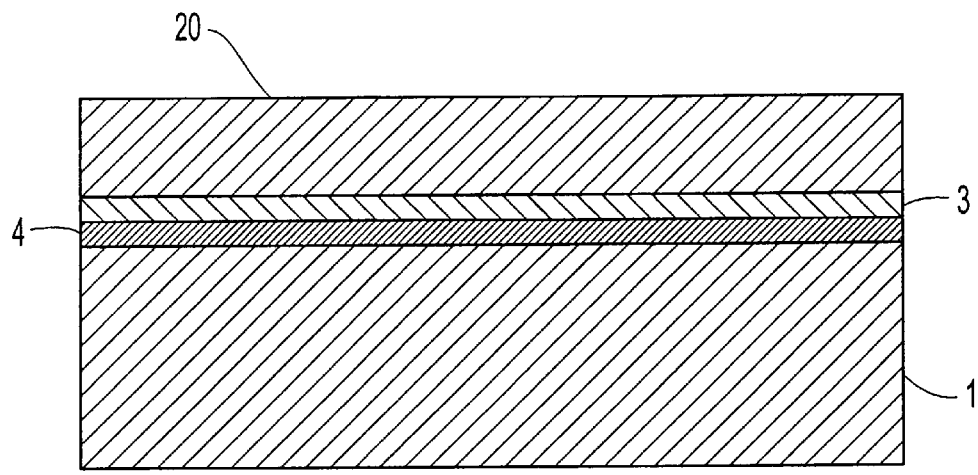
Figure 2C:
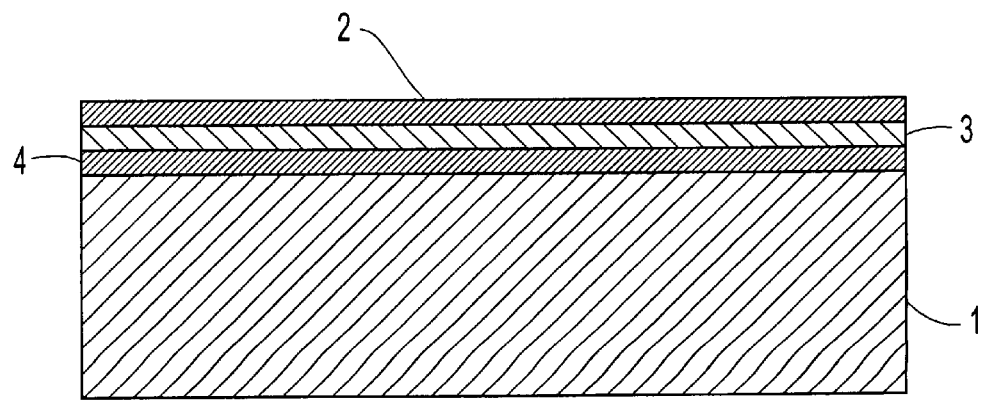

FIG. 1 is a cross-sectional view of a first embodiment of a semiconductor device in accordance with the present invention. FIGS. 2(a)-(c) show steps showing a method for making the semiconductor device of the first embodiment of the present invention. As shown in FIG. 1, in the semiconductor device of the present invention, a thermally conductive film 4 is provided on an insulating supporting substrate 1, an interlayer insulating film 3 as an example of a first insulating film is formed thereon, and a single-crystal silicon film 2 as an example of a single-crystal semiconductor film is formed thereon with the interlayer insulating film 3 therebetween.

A method for making the semiconductor device will be described with reference to FIGS. 2(a)-(c).

As shown in FIG. 2(a), a thermally conductive film 4 is formed on one entire surface of an insulating supporting substrate 1. In this embodiment, a quartz glass substrate having a thickness of 0.4 to 1.1 mm is used as the supporting substrate. The substrate, however, may be any other glass substrate having high insulating properties, other than the quartz glass substrate. In some cases, a flexible substrate may be used. The thermally conductive film 4 is obtained by, for example, depositing molybdenum (Mo) by a sputtering process up to a thickness of 100 to 1,000 nm. The thermally conductive film 4 is not limited to molybdenum, and any other materials which are stable at a maximum temperature of the thermal process for producing the device can be used. Examples of preferred materials include high melting point metals such as tungsten, tantalum, cobalt, and titanium, alloys thereof, polycrystalline silicon, and suicides such as tungsten silicide and molybdenum silicide. Examples of forming methods other than the sputtering process include a CVD process and an electron beam evaporation process. Use of high melting point metals and alloys thereof which have high electrical conductivity, in addition to high thermal conductivity, is preferable because the film is used as a wiring or an electrode, as will be described below.

An interlayer insulating film 3 is formed in order to ensure electrical insulation between the thermally conductive film 4 and a single-crystal silicon film 2 formed thereon. An example of the interlayer insulating film 3 is a silicon oxide film with a thickness of approximately 50 to 1,000 nm formed by processes such as a sputtering process or a CVD process. The entire surface of the resulting interlayer insulating film 3 on the surface of the supporting substrate 1 may be planarized by polishing globally. An example of a polishing method is a chemomechanical polishing (CMP) process.

Next, the supporting substrate 1 with the interlayer insulating film 3 provided on the surface is adhered to a single-crystal silicon substrate 20 as shown in FIG. 2(b). The single-crystal silicon substrate 20 used for adhesion has a thickness, for example, of 300 to 900 µm. The surface of a thickness of approximately 50 to 800 nm may be previously oxidized or nitrided to form an oxide film layer or a nitride film layer. The interface formed by adhering the single-crystal silicon film 2 and the interlayer insulating film 3 can be formed by thermal oxidation or thermal nitriding and having superior electrical characteristics. The adhesion step may be a method for directly adhering these two substrates by, for example, heat treatment at 300° C. for 2 hours. The heating temperature may be increased to approximately 450° C. to further increase the adhesion strength, however, such heating will cause defects such as cracks of the single crystal silicon substrate 20 and deterioration of substrate quality, because there is a significant difference in the coefficients of thermal expansion between the insulating supporting substrate 1 composed of quarts glass or the like, the single crystal silicon substrate 20, and a material used as the thermally conductive film 3. In order to suppress formation of defects such as cracks, the single crystal silicon substrate 20 subjected to heat treatment at 300° C. for adhesion may be thinned by wet etching or CMP to a thickness of approximately 100 to 150 µm, and may then be subjected to heat treatment at a high temperature. That is, using an aqueous solution KOH at 80° C., etching is performed so that the thickness of the single crystal silicon substrate 20 becomes 150 µm. Next, these two adhered substrates are subjected to heat treatment at 450° C. to increase the adhesion strength. As shown in FIG. 2(c), the surface of the adhered single-crystal silicon substrate is polished to form a single-crystal silicon film 2 with a thickness of 3 to 5 µm.

The thinned single-crystal silicon substrate is finished by a plasma-assisted chemical etching (PACE) process until the thickness of the single-crystal silicon film 2 remaining on the interlayer insulating film 3 becomes approximately 0.05 to 0.8 µm. The PACE process enables production of a single-crystal silicon film 2 having thickness uniformity within 10% with respect to, for example, a thickness of 100 nm.

The above-described steps produce a semiconductor device having a thermally conductive film 4.

According to the method of this embodiment, as described above, a thermally conductive film 4 is disposed between the interlayer insulating film 3 and the supporting substrate 1, hence, the thermally conductive film 4 conducts heat to further make the thermal distribution in the substrate plane uniform during heat treatment in the adhesion step, compared to directly adhering a single-crystal silicon film to the supporting substrate 1. Thus, uniform adhesion in the substrate plane, which increases the adhesion strength, is achieved, and defects and deterioration of semiconductor devices in final products can be reduced. Since, in the semiconductor device produced by the method of this embodiment, the thermally conductive film 4 is arranged opposite to the single-crystal silicon film 2 with the interlayer insulating film 3 therebetween, the thermally conductive film 4 can dissipate heat generated in the single-crystal silicon film 2. Such enhancement of the heat-dissipating function during the operation of the semiconductor device enables normal operation while controlling the operational temperature within a predetermined range when the semiconductor device is used for large electrical power drive or high frequency drive generating a large amount of heat during the operation.

In this embodiment, it is preferable that the formed interlayer insulating film 3 be thinned by the above-described CMP treatment. Since such thinning facilitates thermal transfer between the adhered single-crystal silicon film 2 and the thermally conductive film 4, depending on the thinness of the interlayer insulating film 3, the thermally conductive film 4 can further promote uniformity of the thermal distribution on the substrate plane. In the operation of a semiconductor device, such as a thin film transistor produced by this embodiment, the heat transfer between the single-crystal silicon film 2 forming a channel region, a source region, and a drain region, and the thermally conductive film 4 is also facilitated, hence, the heat-dissipating function by the thermally conductive film 4 is improved. In addition, when the interlayer insulating film 3 is used as a dielectric film to form a capacitor such as a storage capacitor, a large capacitance is achieved, depending on the thinness of the interlayer insulating film 3.

Thinning by the CMP treatment of the interlayer insulating film 3 also enables planarization in the order of nanometers, and thus reduces surface irregularity of the single-crystal silicon film 2 adhered to the interlayer insulating film 3. The thickness of the thinned interlayer insulating film 3 is preferably 300 nm or less. By thinning to such extent, the thermally conductive film 4 significantly promotes uniformity of the thermal distribution on the substrate plane in the production process, and the thinned interlayer insulating film 3 significantly improves the heat-dissipating function of the thermally conductive film 4 during the operation of a thin film transistor so produced. In addition, when the interlayer insulating film 3 is used as a dielectric film to form, for example, a storage capacitor, a large capacitance is achieved depending on the thinness of the dielectric film.

When the thickness of the interlayer insulating film 3 is relatively large, that is, approximately 1,000 nm, the effect of the thermally conductive film 4 is sufficiently recognizable. The thickness of the interlayer insulating film 3 can be reduced to approximately 50 nm by any known thinning technique.

Second Embodiment

FIGS. 3(a) to 3(e) show steps of a method for making a semiconductor device in accordance with a second embodiment of the present invention. The same reference numerals as in FIGS. 1 and 2 indicate the films or parts formed by the same steps. In this embodiment, the step for forming the interlayer insulating film 3 on the surface of the supporting substrate 1 including the thermally conductive film 4 shown in FIG. 2(a) is exactly the same as that in the first embodiment.

Figure 3A:
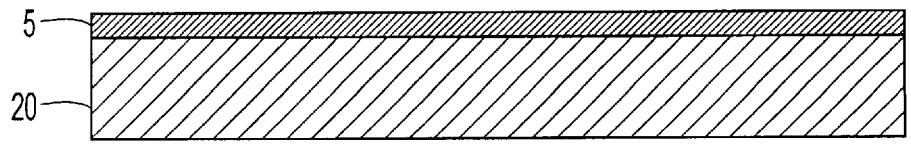
FIGS. 3(a)-(e) show production steps of a method for making a semiconductor device of a second embodiment in accordance with the present invention.
Figure 3B:
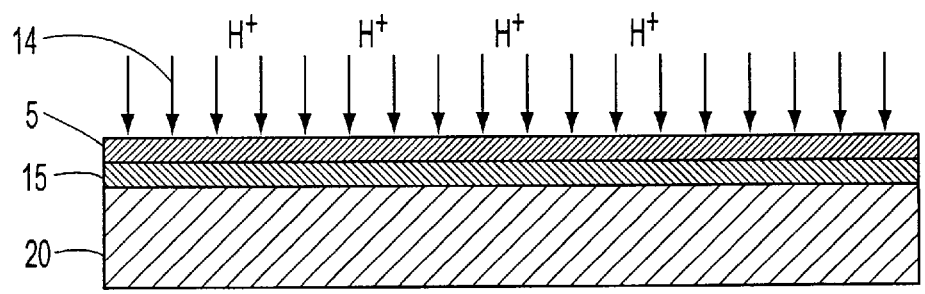

FIG. 3(a) shows a single crystal silicon substrate 20 as an example of a single-crystal semiconductor substrate used for adhesion. The single-crystal silicon substrate 20 has a thickness of, for example, 300 to 900 μm, and the surface thereof is preliminarily oxidized to form an oxide film layer 5 with a thickness of 0.05 to 0.8 μm as an example of a third insulating film. Next, as shown in FIG. 3(b), hydrogen ions 14 are implanted into the single-crystal silicon substrate 20. For example, in this embodiment, hydrogen ions (H$^+$) are implanted at an accelerated voltage of 100 keV and a dose of $10^{16}$ cm$^{-2}$. By such treatment, a high hydrogen ion concentration layer 15 is formed on the single-crystal silicon substrate 20.

Figure 3C:
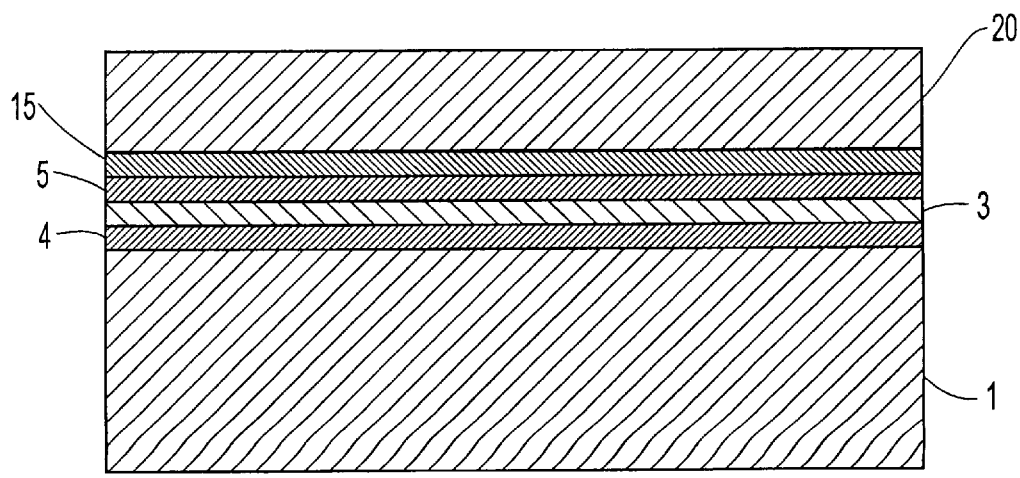

As shown in FIG. 3(c), the ion-implanted single crystal silicon substrate 20 (inverted between upper and lower sides from the state shown in FIG. 3(b)) is adhered to the supporting substrate 1 provided with the thermally conductive film 4 and the interlayer insulating film 3, as described in FIG. 2. A typical adhesion step includes direct adhering these two substrates by heat treatment at 300° C. for 2 hours.

Figure 3D:
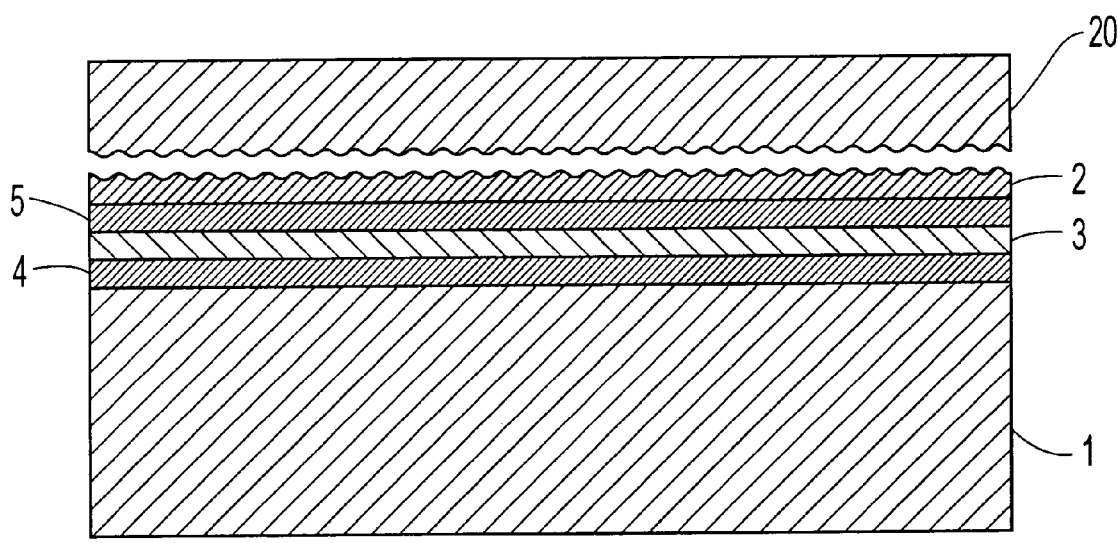

Next, as shown in FIG. 3(d), heat treatment is performed to separate the single-crystal silicon substrate 20 from the supporting substrate 1 so that an oxide film 5 at the adhered side of the single-crystal silicon substrate 20 and a single-crystal silicon film 2 remain on the supporting substrate 1 (the interlayer insulating film 3 and the oxide film 5 will become embedded oxide films when a semiconductor device is produced). Separation of the single-crystal silicon substrate 20 is caused by rupture of silicon bonds in a layer near the surface of the single-crystal silicon substrate 20 by the hydrogen ions introduced to the single-crystal silicon substrate 20. In this embodiment, the two adhered substrates are heated to 600° C. at a heating rate of 20° C. per minutes or more. By the heat treatment, the adhered single-crystal silicon substrate 20 is separated from the supporting substrate 1 to form a silicon oxide film 3 with a thickness of approximately 400 nm and a single-crystal silicon film 2 with a thickness of approximately 200 nm thereon.

In this embodiment, the formed thermally conductive film 4 prevents a problem occurring in a conventional process (U.S. Pat. No. 5,374,564) in which the substrate is not locally separated in the high hydrogen ion concentration layer 15, and thus facilitates separation of the single-crystal silicon substrate 20 from the single-crystal silicon film 2. That is, the oxide film 5 is formed as a third insulating film on the surface of the single-crystal silicon substrate 20 prior to adhesion of the single-crystal silicon substrate 20, and the thermally conductive film 4 makes the thermal distribution in the substrate plane uniform. Thus, uniform separation in the high hydrogen ion concentration layer 15 of the substrate plane is achieved.

Figure 3E:
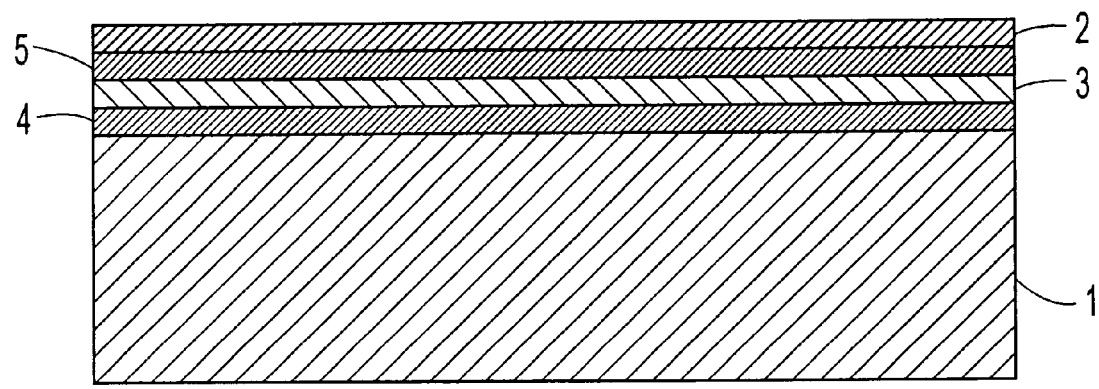

FIG. 3(e) is a cross-sectional view of the semiconductor device after separation. Since the semiconductor device has surface irregularities of several nanometers on the surface of the single-crystal silicon film 2, the surface must be planarized. Thus, this embodiment employs contact polishing by a CMP process to slightly polish the substrate surface (polished depth less than 10 nm). A hydrogen annealing process including heat treatment in a hydrogen atmosphere may also achieve planarization.

The resulting semiconductor device has further improved uniformity of the single-crystal silicon film thickness. For example, the single-crystal silicon film 2 has a higher thickness uniformity within 5% with respect to, for example, a thickness of 200 nm, compared to the semiconductor device produced in the first embodiment. These steps wherein the single-crystal silicon substrate 20 is easily separated in the high concentration hydrogen ion implanted region can produce a semiconductor device provided with a thermally conductive film 4, with a high production yield in the production process.

Third Embodiment

FIGS. 4(a) to 4(f) shows steps of a method for making a semiconductor device of a third embodiment of the present invention. The same reference numerals as in FIGS. 1 and 2 indicate the layers or parts formed by the same steps. In this embodiment, the step for forming the interlayer insulating film 3 on the surface of the supporting substrate 1 including the thermally conductive film 4 shown in FIG. 2(a) is exactly the same as that in the first embodiment.

Figure 4A:
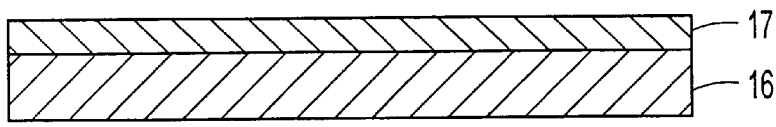
FIGS. 4(a)-(f) show production steps of a method for making a semiconductor device of a third embodiment in accordance with the present invention.

FIG. 4(a) shows a single crystal silicon substrate 16 as an example of a single-crystal semiconductor substrate which is used for forming a single-crystal silicon film 2 for adhesion. The single-crystal silicon substrate 16 has a thickness of, for example, 600 μm, and the surface thereof is subjected to anodic oxidation in a HF-ethanol solution to form a porous layer 17. The single-crystal silicon substrate 16 with an approximately 12 μm thick porous surface is subjected to heat treatment at 1,050° C. in a hydrogen atmosphere to planarize the surface of the porous layer 17. Such treatment is performed to reduce the defect density in a single-crystal silicon film to be formed on the single-crystal silicon substrate 16 later and to improve quality.

Figure 4B:
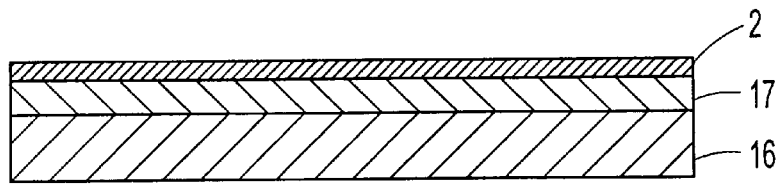

Next, as shown in FIG. 4(b), a single-crystal silicon film 2 is formed on the silicon substrate 16 with the planarized porous silicon layer 17 by epitaxial growth. In this embodiment, the thickness of the single-crystal silicon film 2 deposited by the epitaxial growth is 500 nm, however, the present invention in not intended to be limited to this thickness. The thickness of the single-crystal silicon layer can be determined without limitation depending on the device to be produced.

Figure 4C:
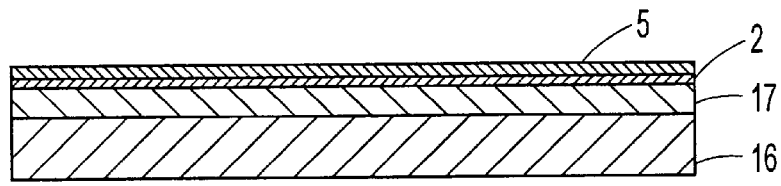
Figure 4D:
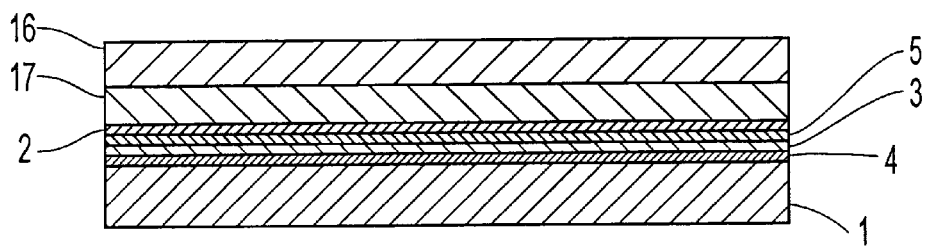

As shown in FIG. 4(c), the surface of the single-crystal silicon film 2 is oxidized to form an oxide film 5 of approximately 50 to 400 nm as an example of a third oxide film, and this will be an embedded oxide film of a semiconductor device after adhesion. As shown in FIG. 4(d), the substrate provided with the single-crystal silicon film 2 and the oxide film layer 5 (inverted between upper and lower sides from the state shown in FIG. 4(c)) is adhered to an insulating supporting substrate 1 provided with a thermally conductive film 4 and an interlayer insulating film 3. Adhering these two substrates is achieved by, for example, direct adhesion by heat treatment at 300° C. for 2 hours.

Figure 4E:
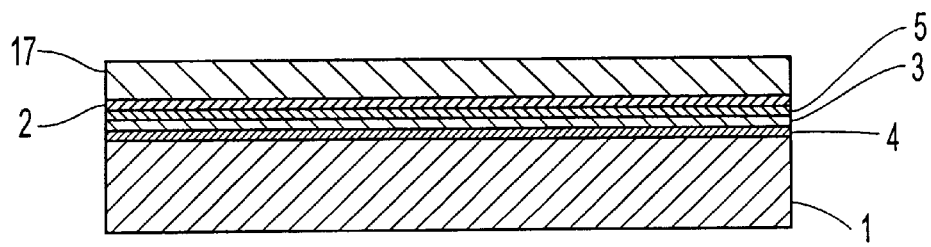

As shown in FIG. 4(e), the single-crystal silicon substrate 16 is polished so that the oxide film layer 5, the single-crystal silicon film 2 and the porous silicon layer 17 remain on the bonded face.

Figure 4F:
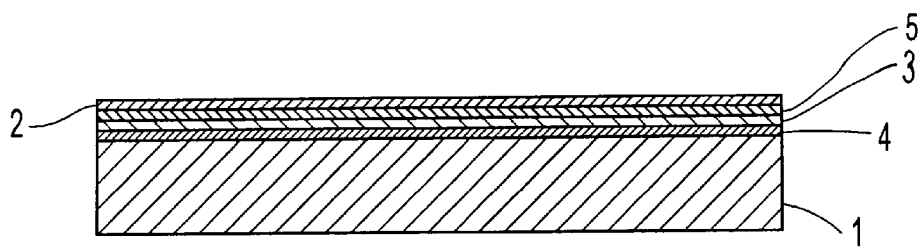

Next, as shown in FIG. 4(f), the porous silicon layer 17 is removed by etching to expose the single-crystal silicon film 2 on the supporting substrate. Since an HF-H$_2$O$_2$ etching solution shows higher etching selectivity with respect to the porous silicon layer 17 than the single-crystal silicon film 2, only the porous silicon layer 17 can be completely removed whereas the single-crystal silicon film 2 can maintain a significantly uniform thickness. Since the single-crystal silicon film 2 of the semiconductor device after removal of porous silicon layer 17 has irregularities of several nanometers, this must be planarized. Thus, this embodiment employs a hydrogen annealing process including heat treatment in a hydrogen atmosphere. Contact polishing by a CMP process for slightly polishing the surface of the single-crystal silicon film 2 of the semiconductor device (polished depth less than 10 nm) may also achieve planarization.

The resulting semiconductor device has a single-crystal silicon film having higher thickness uniformity to within several percent, compared to the first embodiment.

These steps wherein the single-crystal silicon substrate 16 is easily adhered and separated can produce a semiconductor device provided with a thermally conductive film 4, with a high production yield.

Fourth Embodiment

Figure 5A:
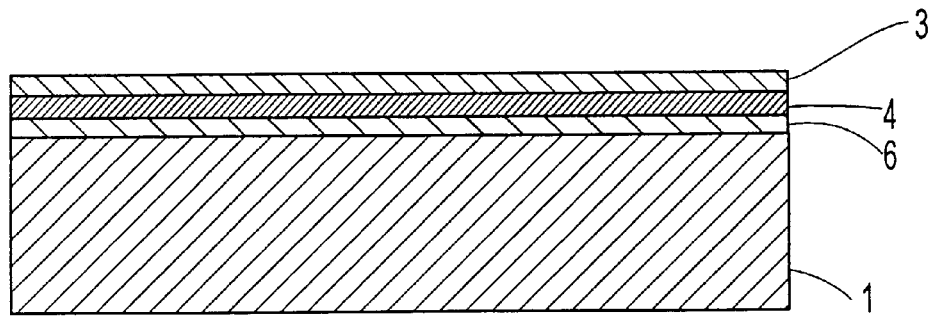
FIGS. 5(a)-(c) show production steps of a method for making a semiconductor device of a fourth embodiment in accordance with the present invention.
Figure 5B:
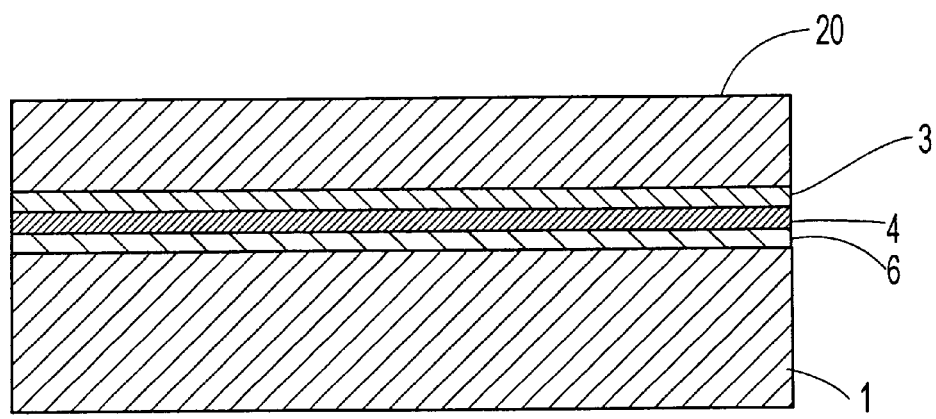
Figure 5C:
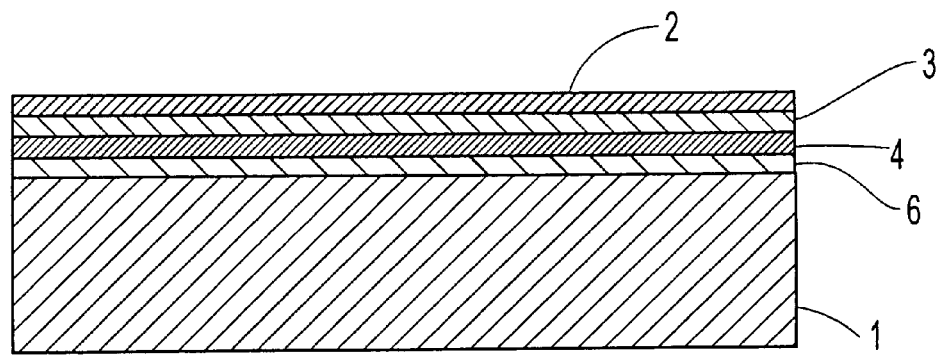

FIGS. 5(a) to 5(c) shows steps of a method for making a semiconductor device of a fourth embodiment of the present invention. The same reference numerals as in FIGS. 1 and 2 indicate the films or parts formed by the same steps.

First, as shown in FIG. 5(a), a second insulating film 6 is formed on one entire surface of an insulating supporting substrate 1. The second insulating film 6 is used as an underlayer to enhance adhesiveness of a thermally conductive film 4 with the supporting substrate 1, as will be described below. Next, the thermally conductive film 4 is formed on the entire surface thereof. An interlayer insulating film 3 is also formed thereon to ensure electrical insulation between the thermally conductive film 4 and a single-crystal silicon film 2 to be formed thereon.

Next, as shown in FIG. 5(b), the supporting substrate 1 provided with the interlayer insulating film 3 is adhered to a single-crystal silicon substrate 20. The surface of the single-crystal silicon substrate 20 for adhesion may be preliminarily oxidized to form an oxide film layer of, for example, approximately 500 to 800 nm. Thus, the interface between the single-crystal silicon film 2 and the interlayer insulating film 3 formed by adhesion may be formed by thermal oxidation to ensure superior electrical characteristics of the interface. Adhesion of these two substrates is achieved by, for example, direct adhesion by heat treatment at 300° C. for 2 hours. The heating temperature may be increased to approximately 450° C. to further increase the adhesion strength, however, such heating will cause defects such as cracks of the single-crystal silicon substrate 20 and deterioration of substrate quality, because there are significant differences in coefficients of thermal expansion among the quartz substrate, the single-crystal silicon substrates, and a material used for the thermally conductive film 3. In order to suppress formation of defects such as cracks, the single-crystal silicon substrate 20 subjected to heat treatment at 300° C. for adhesion may be thinned by wet etching or CMP to a thickness of approximately 100 to 150 $\mu$m, and then may be subjected to heat treatment at a higher temperature. That is, using an aqueous KOH solution at 80° C., etching is performed so that the thickness of the single-crystal silicon substrate 20 becomes 150 $\mu$m. Next, these two adhered substrates are subjected to heat treatment at 450° C. to increase the adhesion strength.

Next, as shown in FIG. 5(c), the adhered substrates are subjected to polishing until the thickness of the single-crystal silicon film 2 becomes 3 to 5 $\mu$m. The thinned substrates are finished by a plasma-assisted chemical etching (PACE) process until the thickness of the single-crystal silicon film 2 becomes approximately 0.05 to 0.8 $\mu$m. The PACE process enables production of a single-crystal silicon film 2 having thickness uniformity within 10% with respect to, for example, a thickness of 100 nm.

These steps wherein the single-crystal silicon substrate 20 is easily adhered and separated can produce a semiconductor device provided with a thermally conductive film 4 with a high production yield.

The second insulating film 6 used in this embodiment is preferably composed of a thermally conductive insulating material. This is used as an underlayer of the thermally conductive film 4 which enhances the adhesion of the thermally conductive film 4 to the supporting substrate 1 and maintains superior thermal uniformity. Examples of the second insulating film 6 include a silicon oxide film, a silicon nitride film and a tantalum oxide film, each having a thickness of approximately 100 to 1,000 nm formed by, for example, a sputtering process, and alloys thereof. When the second insulating film 6 is formed of an insulating material having high adhesiveness to the supporting substrate 1 and the thermally conductive film 4, adhesiveness between the supporting substrate 1 and the thermally conductive film 4 which are composed of different materials is improved, resulting in improved production yield and reliability of the device.

Although this embodiment is an applied method for making a semiconductor device in the first embodiment, the second insulating film 6 may be formed in the second and third embodiments. Thus, this embodiment is applicable to the second and third embodiments to enhance adhesiveness between the thermally conductive film 4 and the insulating supporting substrate 1 by forming an second insulating film 6 on one surface of the insulating supporting substrate 1. A semiconductor device having high uniformity can be thereby produced.

Fifth Embodiment

Figure 6:
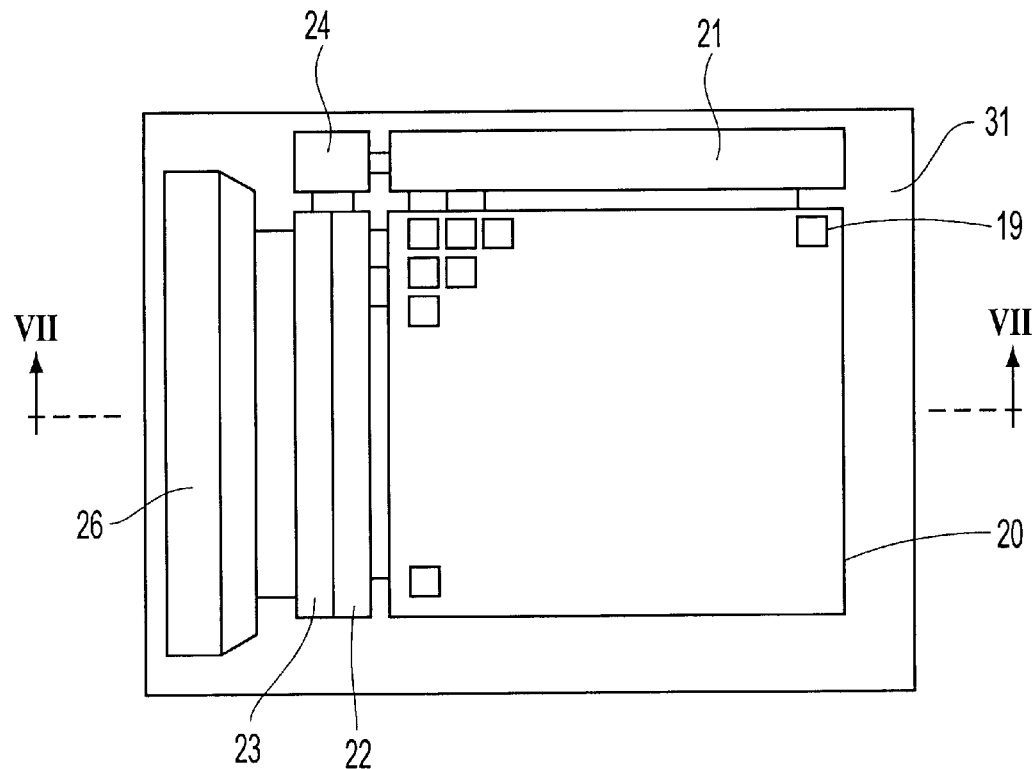
FIG. 6 is a graphical plan view of a planar layout of a transmissive liquid crystal panel.
Figure 7:
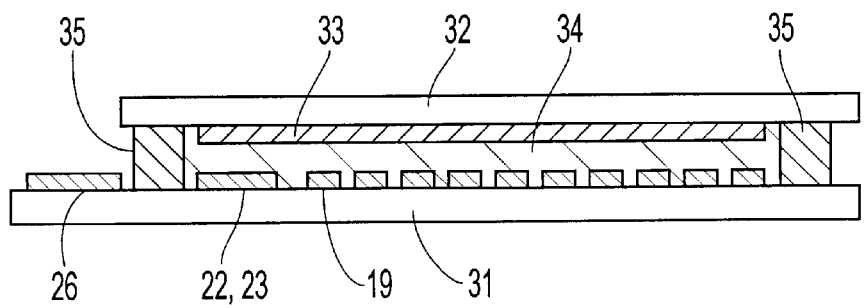
FIG. 7 is a cross-sectional view taken from line VII–VII in FIG. 6.

As a fifth embodiment of the present invention, a transmissive liquid crystal device will be described with reference to FIGS. 6 and 7 as a preferred example of an electro-optical device using a semiconductor device produced by the above-mentioned method of the present invention. FIG. 6 is a graphical plan view of a planar layout of the transmissive liquid crystal device, and FIG. 7 is a cross-sectional view taken from line VII–VII in FIG. 6. In the schematic view of FIG. 6, portions unnecessary for the description are omitted to facilitate understanding.

As shown in FIG. 6, an image display region 20 is provided on a light-transmissive insulating supporting substrate 31 composed of glass, and pixel electrodes 19 are arranged in a matrix. The insulating supporting substrate 31 corresponds to the supporting substrate 1 of the semiconductor devices produced in the first to fourth embodiments. That is, in this embodiment, the single-crystal semiconductor film 2 (single-crystal silicon film) formed on the insulating supporting substrate 1 of the semiconductor device produced in one of the first to fourth embodiments constitutes a TFT as an example of a first switching element in each pixel. A plurality of scanning lines and data lines are orthogonally arranged on the image display region 20. Each of the plurality of pixels arranged in the matrix is provided with a pixel electrode 19 and a TFT in which a gate is connected to a scanning line, a source is connected to a data line, and a drain is connected to the pixel electrode 19, and provided with a storage capacitor (holding capacitor) electrically connected to the pixel electrode 19 for holding a voltage applied to the pixel electrode 19.

A scanning line driving circuit 21 and a data line driving circuit 22, as examples of peripheral circuits for driving each pixel, are formed on the periphery of the image display region 20. The scanning line driving circuit 21 serially scans the scanning lines, whereas the data line driving circuit 22 supplies image signals corresponding to the image data to the data lines. The peripheral circuits provided also include an input circuit 23 inputting the image data from the exterior via a pad region 26 and a timing control circuit 24 for controlling these circuits. These peripheral circuits are composed of TFTs formed by the same step or a different step from that for the TFTs provided for switching in the respective pixels, and load elements such as resistors and capacitors. Each TFT in these peripheral circuits is composed of a source region, a drain region and a channel region, formed in a single-crystal silicon film 2, as in the TFT provided in each pixel, and other elements such as the resistors may also be composed of the single-crystal silicon film 2.

As shown in FIG. 7, the liquid crystal device includes a light-transmissive insulating substrate 31 provided with display pixels and driving circuits, and a light-transmissive substrate 32 composed of glass, disposed opposite thereto with a predetermined gap therebetween, provided with an opposite electrode 33 composed of a transparent conductive (ITO) film, the periphery thereof being sealed with a sealant 35. The gap between the paired substrates is filled with a liquid crystal 34, for example, a known twisted nematic (TN) liquid crystal, a homeotropic liquid crystal in which liquid crystal molecules are substantially aligned in the vertical direction when voltage is not applied, or a homogeneous liquid crystal in which liquid crystal molecules are substantially aligned in the horizontal direction without twisting when voltage is not applied. The sealant 35 is provided so that the pad region 26 is located at the exterior of the sealant 35 so as to input the external signals.

In the production of the supporting substrate 31 shown in FIGS. 6 and 7, many supporting substrates 31 are simultaneously produced from a large substrate in a state of manufacturing the large supporting substrate and then dividing by scribing after completing the manufacturing of the supporting substrate 31. Such a production process yields a high production efficiency and low production fluctuation.

Figure 8:
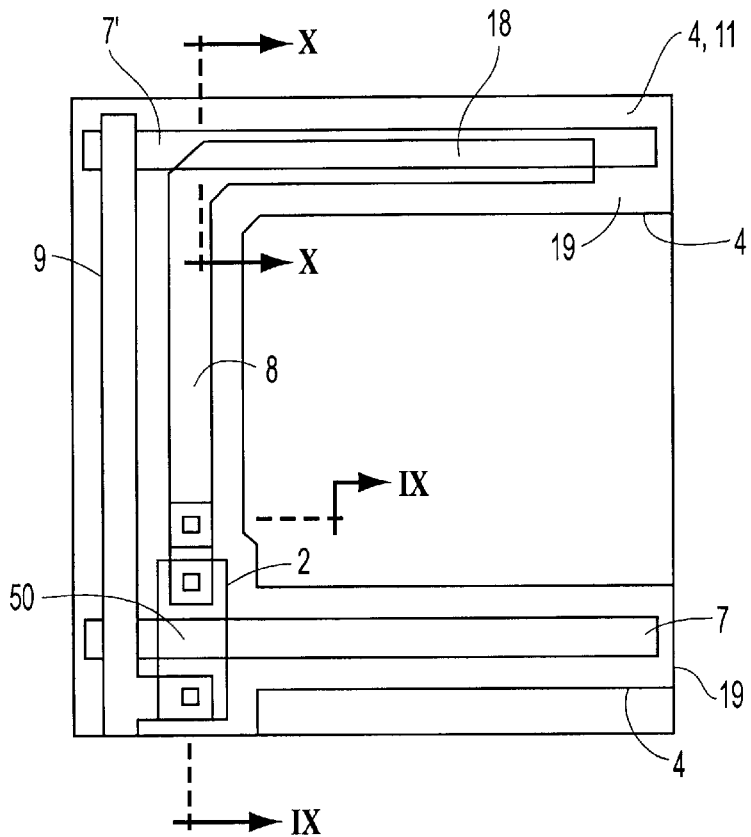
FIG. 8 is an enlarged plan view of a pixel section of a transmissive liquid crystal panel.

The configuration of each pixel in the resulting liquid crystal device will now be further described with reference to FIGS. 8 and 9. FIG. 8 is an enlarged plan view of the pixel region of a transmissive liquid crystal device using the semiconductor device produced in the present invention, and FIG. 9 is a cross-sectional view taken from line IX–IX in FIG. 8 and shows the TFT section in a pixel.

Figure 9:
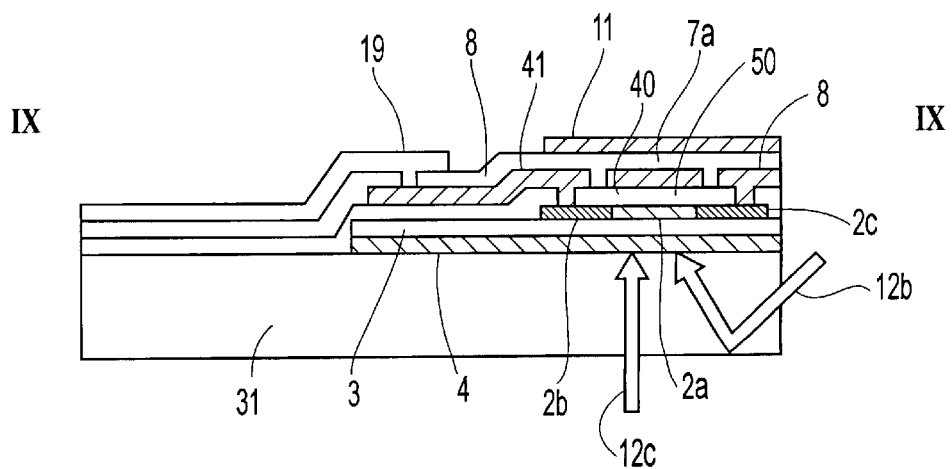
FIG. 9 is a cross-sectional view taken from line IX–IX in FIG. 8.

In FIGS. 8 and 9, each pixel is provided with a TFT 50 as a switching element for controlling writing of charges into the pixel electrode 19. Each pixel is provided with a single-crystal silicon film 2 which forms a channel region 2a, a source region 2c, and a drain region 2b, and a gate electrode 7a is formed on the single-crystal silicon film 2 separated by a gate insulating film 40 therebetween to form a TFT 50. The gate electrode 7a is electrically connected to a scanning line 7, the source region 2c is connected to a data line 9, and the drain region 2b is connected to a drain electrode 8 which is connected to the pixel electrode 19 and a storage capacitor 18 in the displaying pixel. For light-shielding the channel region 2a in the TFT 50 and for preventing optical leakage between pixels, an upper light-shielding layer 11 is formed on the top with an insulating film 41 therebetween. The TFT 50 and gaps between adjacent pixel electrodes 19 are thereby light-shielded.

This embodiment has a configuration in which a thermally conductive film 4 formed in the production of the semiconductor device according to any one of the first to fourth embodiments is arranged below the TFT 50 as a first switching element of each pixel, and below the region for forming TFTs as second switching elements constituting peripheral circuits such as a driving circuit, a displaying signal processing circuit, an input circuit, and a timing control circuit. Thus, the thermally conductive film 4 can achieve not only a uniform thermal distribution during the production of the semiconductor device as described above, but also heat dissipation, which includes heat absorbed from external light, during the operation of the TFT 50 fabricated in the single-crystal silicon film 2 as a semiconductor device after production.

When the insulating supporting substrate 31 provided with TFTs 50 is used as an element-side substrate of an active matrix liquid crystal device, a thermally conductive film 4 composed of a light-shielding material such as a high melting point metal can be used for shielding from the external light such as projection light and reflected light during operation of the liquid crystal device.

This effect will now be described in more detail with reference to FIG. 9. The thermally conductive film 4 is provided between the channel region 2a of the TFT 50 and the light-transmissive insulating supporting substrate 31 so as to cover at least the channel region 2a from the side of the supporting substrate 31 (from the bottom in the drawing). The thermally conductive film 4 is preferably composed of a high melting-point metal, such as molybdenum, tungsten, tantalum, cobalt or titanium, an alloy thereof, polycrystalline silicon, or a silicide, such as tungsten silicide or molybdenum silicide. Examples of forming methods other than the sputtering process include a CVD process and an electron beam evaporation process. The thermally conductive film 4 can shield from any type of incident light from the rear surface of the substrate.

When a conventional process, for example, Japanese Patent Application Laid-Open No. 4-346418, for forming a single-crystal silicon film by adhesion to a light-transmissive insulating substrate is applied to the switching element as in this embodiment, a film functioning as a light-shielding film is not formed between the single-crystal silicon film and the insulating supporting substrate. Thus, light entering from the rear side is directly incident on the single-crystal silicon film to generate paired electrons and positive holes in the channel. As a result, leaking current tends to bring the state of the transistor toward the OFF state. In this embodiment, however, the thermally conductive film 4 composed of a light-shielding material shields from direct incident light 12c and reflected light 12b from the rear face of the substrate, hence, a tendency of increased leaking current is not observed. Since the conventional configuration does not have a film functioning as a light-shielding film, the temperature of elements such as a transistor increases by absorption in the channel of light incident on the rear surface. For example, temperature rise at the pn junction formed in a element causes an increased reverse direction current of the pn junction. As a result, charges required for holding a voltage decrease as the current increases at the pn junction, and the resulting decrease in mobility in the TFT causes a reduction in voltage applied to the liquid crystal. In this embodiment, however, the thermally conductive film 4 composed of a light-shielding material shields from the direct incident light 12c and the reflected light 12b from the rear face of the substrate, and dissipates heat generated in the TFT 50, hence, temperature rise is totally suppressed and the above-mentioned reduction of the voltage in the liquid crystal does not occur.

In this embodiment, the thermally conductive film 4 may remain below the storage capacitor 18 connected to the pixel electrode 19 shown in FIG. 8.

It is preferable that the thermally conductive film 4 be connected to a predetermined source potential in view of electrical stability of operation of the overlying TFT.

Figure 10:
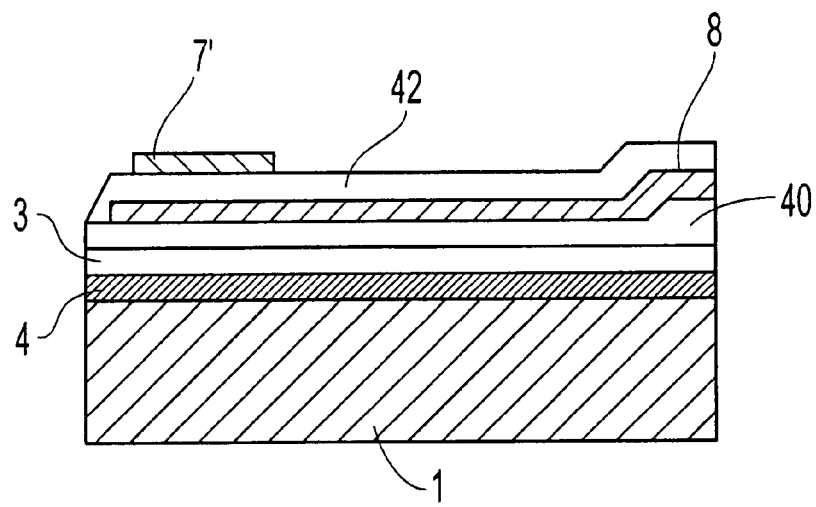
FIG. 10 is a cross-sectional view taken from line X–X in accordance with a storage capacitor in FIG. 8.

FIG. 10 is a cross-sectional view of the storage capacitor (taken from line X–X in FIG. 8). An insulating film 42 is disposed between a drain electrode 8 used as one electrode of the storage capacitor and a preceding gate electrode 7' functioning as the other electrode of the storage capacitor so that the storage capacitor 18 is formed at the position in which these two electrodes separated by the insulating film 42 overlap each other. The thermally conductive film 4 formed under the TFT for switching extends below the drain electrode 8 to form a light-shielding film. The bottom of the drain electrode 8 is shielded from the external light. Thus, heat generation in wiring can be suppressed even when the drain electrode 8 is formed of a silicon material having a large absorption coefficient. Accordingly, a silicon material having a large absorption coefficient which is often used for a gate wiring 7 can also be used as a drain electrode 8. Alternatively, the single-crystal silicon film 2 used in the channel region 2a may be extended so that the drain electrode 8 is formed of the single-crystal silicon film 2. By dissipating heat formed by light absorption in the drain electrode 8 to the exterior through the thermally conductive film 4, the heat conducted to the drain electrode 8 from the pixel electrode 19 can be dissipated to the exterior.

Alternatively, the thermally conductive film 4 may be used as one electrode of the storage capacitor 18 connected to the pixel electrode, as shown in FIG. 8, in this embodiment.

Figure 11:
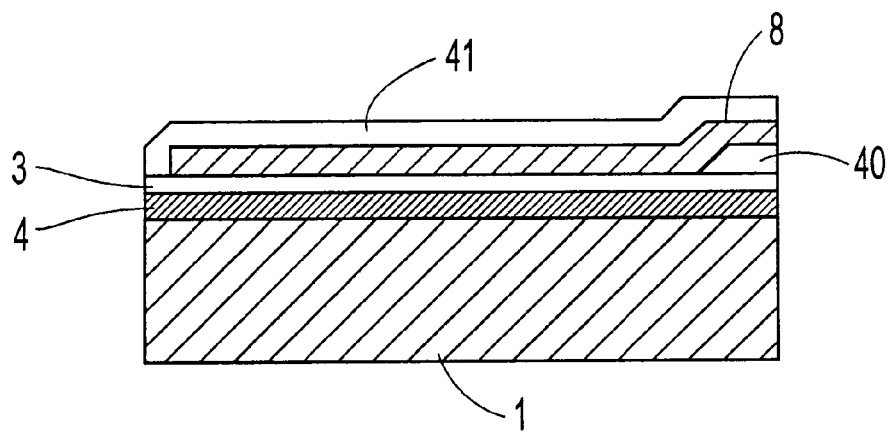
FIG. 11 is a cross-sectional view in accordance with a modification of the storage capacitor in FIG. 8, which corresponds to the X–X cross section.

FIG. 11 is a cross-sectional view of a modification of such a storage capacitor. One electrode of a storage capacitor is composed of a drain electrode 8, and the other electrode is composed of a thermally conductive film 4 which also shields the storage capacitor 18 from light. An interlayer insulating film 3, which is described in the first to fourth embodiments, is disposed between these electrodes and functions as a dielectric film. The storage capacitor 18 is formed between the thermally conductive film 4 and the drain electrode 8. A preferable thickness of the interlayer insulating film 3 for achieving a large capacitance is in a range of 50 to 200 nm. It is preferable that the thermally conductive film 4 be connected to a power source potential which is equal to the potential VLC which is applied to the opposite electrode 33 of the liquid crystal device. The thermally conductive film 4 may be extended from the bottom of the TFT so as to cover the bottom of the drain electrode 8, as shown in FIG. 10. In such a configuration, a material for the gate electrode and the scanning line 7 can also be used as the drain electrode 8. Thus, in FIG. 10, the interlayer insulating film 41 is formed over the gate electrode 7a and the drain electrode 8, and the total number of layers is reduced. The single-crystal silicon film 2 used as the channel region 2a may be extended so that the drain electrode 8 is formed of the single-crystal silicon film 2. As described above, the use of the thermally conductive film 4 as one electrode of the storage capacitor 18 connected to the pixel electrode enables complete light-shielding of the drain electrode 8 and formation of a sufficient storage capacitor 18 under the drain electrode 8. Charge retention in each pixel is, thereby, improved during the operation of the liquid crystal device.

In the embodiments described above, the pattern of the light-shielding film is determined on the basis of arrangement of TFTs formed thereon. The thermally conductive film 4 used as a light-shielding film in the present invention is patterned after patterning of the single-crystal silicon film 2 to achieve the above described object of light-shielding. The patterning of the light-shielding film may be performed by a continuous step for the single-crystal silicon film 2 and the interlayer insulating film 3, or by different steps.

Light-shielding and heat-dissipation of the TFT 50 used for pixels have been described above. In this embodiment, the thermally conductive film 4 is also used for light-shielding and heat-dissipation of TFTs in the peripheral circuits, such as a scanning line driving circuit 21 and a data line driving circuit 22, as shown in FIG. 6, and of TFTs provided in a pad region 26 for electrostatic protection.

An actual configuration of the TFT as an example of the second switching elements in the peripheral circuits, such as the scanning line driving circuit 21 and the data line driving circuit 22 shown in FIG. 6 will now be described with reference to FIGS. 12 to 15.

Figure 12:
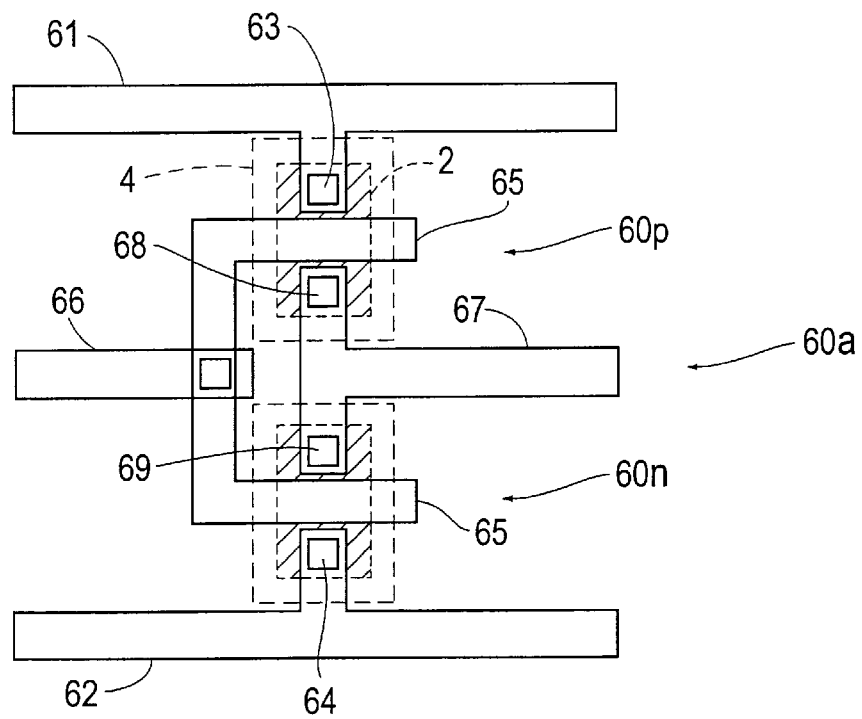
FIG. 12 is a plan view of an embodiment of a thin film transistor constituting a peripheral driving circuit.

In a configuration shown in FIG. 12, the TFT in the peripheral circuits is composed of a complementary TFT 60a which includes a p-channel TFT 60p and an n-channel TFT 60n. In light-shielding regions surrounded with dotted lines in the drawing, islands of the single-crystal silicon film 2 provided with channel regions are formed. Islands of the thermally conductive film 4 having a planar shape and a size larger than that of the single-crystal silicon film 2 and composed of a light-shielding material are formed between the single-crystal silicon film 2 and the supporting substrate separated by an interlayer insulating film. In the TFTs 60p and 60n, a high potential line 61 and a low potential line 62 are connected to source regions through contact holes 63 and 64, respectively, an input wiring 66 is connected to a gate electrode 65, and an output wiring 67 is connected to drain regions through contact holes 68 and 69. Thus, the respective channel regions in the TFTs 60p and 60n are covered with islands of the thermally conductive film 4, as viewed from the supporting substrate 1 side. Accordingly, the thermally conductive film 4 has a light-shielding function for each channel region and a heat-dissipating function for each TFT.

In the complementary TFT 60a shown in FIG. 12, the thermally conductive film 4 is arranged opposed to the single-crystal silicon film 2 separated by the interlayer insulating film, hence, the thermally conductive film 4 can dissipate heat generated by a current flowing in the single-crystal silicon film 2, which functions as current paths of the TFTs 60p and 60n during the operation of the peripheral circuits. Such enhancement of the heat-dissipating function during the operation enables normal operation in use for large electrical power drive or high frequency drive, generating a large amount of heat. Since the thermally conductive film 4 is composed of a light-shielding material, the thermally conductive film 4 shields the single-crystal silicon film 2 from incident light, such as projection light and reflected light from the supporting substrate. Such enhancement of the light-shielding function during operation permits suppression of temperature rise caused by heating of the device itself, including TFT 60a, and intense incident light such as projection light. When the peripheral circuits, such as the scanning line driving circuit 21 and the data line driving circuit 22, for large current drive or high frequency drive generating a large amount of heat are composed of complementary TFTs 60a having superior heat-dissipating and light-shielding functions, such a configuration has a significant advantage of suppression of temperature rise. Furthermore, the thermally conductive film 4 in the complementary TFT 60a can effectively prevent optical leakage of incident light by the photoelectric effect in the single-crystal silicon film 4.

Figure 13:
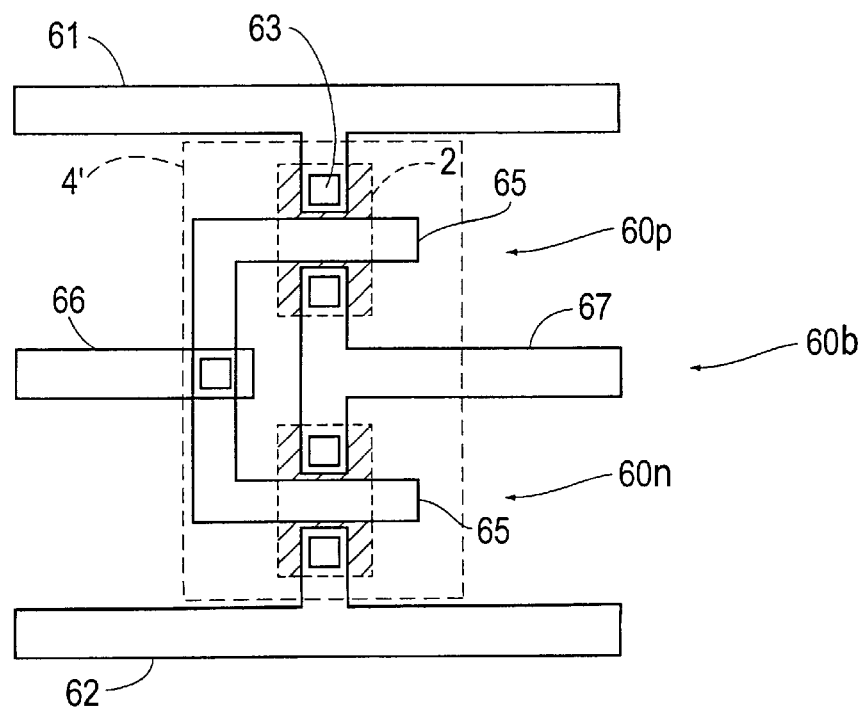
FIG. 13 is a plan view of another embodiment of a thin film transistor constituting a peripheral driving circuit.

Next, FIG. 13 shows another complementary TFT 60b which is slightly different in the configuration of the thermally conductive film from the complementary TFT 60a shown in FIG. 12. In FIG. 13, the same reference numerals are assigned to the same elements as those in FIG. 12, and description thereof will be omitted.

In FIG. 13, an island of a thermally conductive film 4' composed of a light-shielding material is formed between a single-crystal silicon film 2 and a supporting substrate separated by an interlayer insulating film, in which the thermally conductive film has a planar shape which is significantly larger than a channel region of each single-crystal silicon film 2 and covers not only the channel regions but also a gate electrode 65. The other configurations are the same as those of the complementary TFT 60a shown in FIG. 12.

According to the complementary TFT 60b shown in FIG. 13, the thermally conductive film 4' having an area larger than that of the complementary TFT 60a shown in FIG. 12 enhances the light-shielding and heat-dissipating functions.

Figure 14:
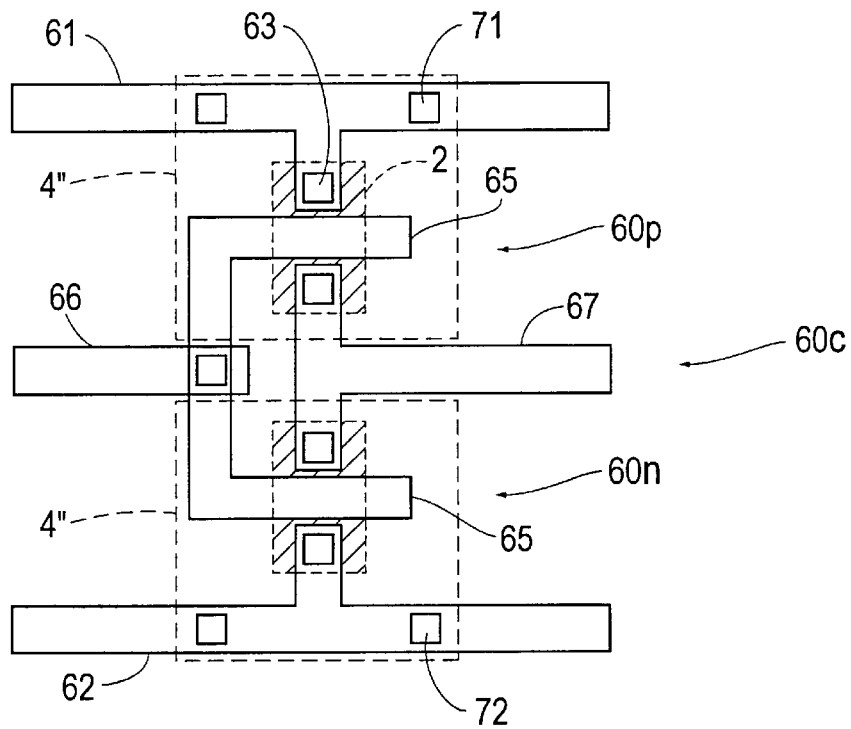
FIG. 14 is a plan view of another embodiment of a thin film transistor constituting a peripheral driving circuit.

FIG. 14 shows a complementary TFT 60c which is slightly different in the configuration of the thermally conductive film from that of the complementary TFT 60b shown in FIG. 13. In FIG. 14, the same reference numerals are assigned to the same elements as those in FIG. 12 or 13, and description for these will be omitted.

In FIG. 14, islands of a thermally conductive film 4' composed of a light-shielding material are separately formed in channel regions between a single-crystal silicon film 2 and a supporting substrate separated by an interlayer insulating film, in which each island has a planar shape which is significantly larger than a channel region of each single-crystal silicon film 2 and covers most of gate electrode 65. Each thermally conductive film 4' is connected to a potential of a high potential line 61 via a contact hole 71 at the side of the TFT 60p, and to a potential of a low potential line 62 via a contact hole 72 at the side of the TFT 60n. The other configurations are the same as those of the complementary TFT 60b shown in FIG. 13.

According to the complementary TFT 60c shown in FIG. 14, the potential of the thermally conductive film 4" changes slightly compared to that of the complementary TFT 60a shown in FIG. 12, hence, characteristics of the TFTs 60p and 60n formed on the thermally conductive film 4" separated by the interlayer insulating film are not substantially affected by the potential change in the thermally conductive film 4".

Figure 15:
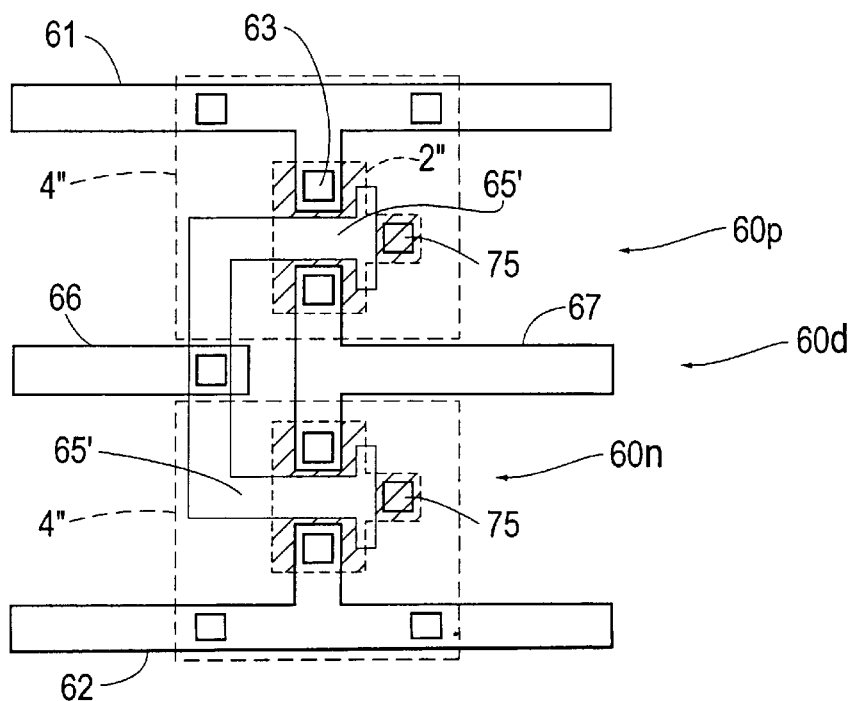
FIG. 15 is a plan view of another embodiment of a thin film transistor constituting a peripheral driving circuit.

FIG. 15 shows a complementary TFT 60d which is slightly different in the wiring pattern from that of the complementary TFT 60b shown in FIG. 13. In FIG. 15, the same reference numerals are assigned to the same elements as those in FIG. 12 to 14, and description thereof will be omitted.

In FIG. 15, channel regions of each TFT 60p and each TFT 60n in the single-crystal silicon film 2' extend to contacts 75 to be connected to the thermally conductive films 4" at the contacts 75. Each end of the gate electrode 65' has a T shape so that the single-crystal silicon film at the contact 75 does not conduct to the channel regardless of control of the gate electrode 65'. Since the TFT using a single-crystal silicon film 2 has large charge transportability, charges tend to remain in the channel region when the TFT is switched from the ON state to the OFF state. Since the charges when transferred to the drain electrode side cause a decreased drain voltage, the charges are drained from the single-crystal silicon film with the extended channel via the contact 75 to the thermally conductive film 4" to stabilize the operation of the TFT. The other configurations are the same as those of the complementary TFT 60c shown in FIG. 14.

According to the complementary TFT 60d shown in FIG. 15, the contact 75 can achieve high-performance transistor characteristics while the thermally conductive film 4" enhances the light-shielding and heat-dissipating functions.

As described above, the TFTs as first switching elements in the pixel section and the TFTs as second switching elements in the peripheral circuits have high heat-dissipating and light-shielding functions by the formation of the thermally conductive film 4 formed below the entire bottom face of each TFT. In particular, the peripheral circuits operate at high speeds by high-speed clock signals and the density of the transistors formed is high, hence, heat will be easily generated. This embodiment can satisfactorily dissipate the heat.

The above respective embodiments have been described with reference to a transmissive liquid crystal device, however, the present invention is not limited to this device, and is applicable to various semiconductor devices, such as other display devices using transmissive display modes, and image input devices (image sensors) for inputting optical information. In these cases, transistor elements for driving each semiconductor device may be formed on a thermally conductive film of the semiconductor device, as described in the above embodiments.

Furthermore, the liquid crystal devices in the present invention can be used for various electronic apparatuses.

Figure 16:
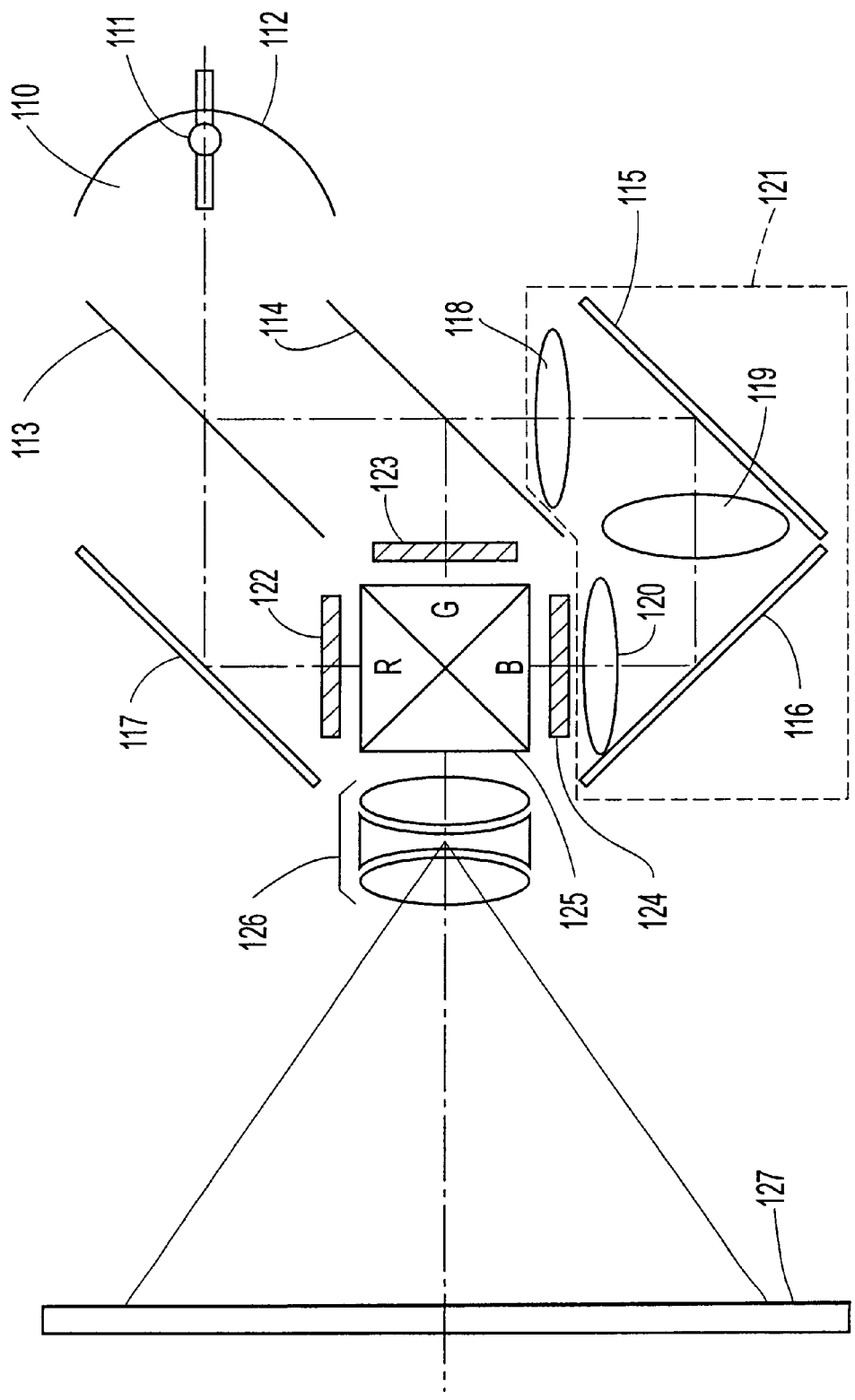
FIG. 16 is a block diagram of a projection type display apparatus using liquid crystal panels in accordance with the present invention as light valves.
Figure 17:
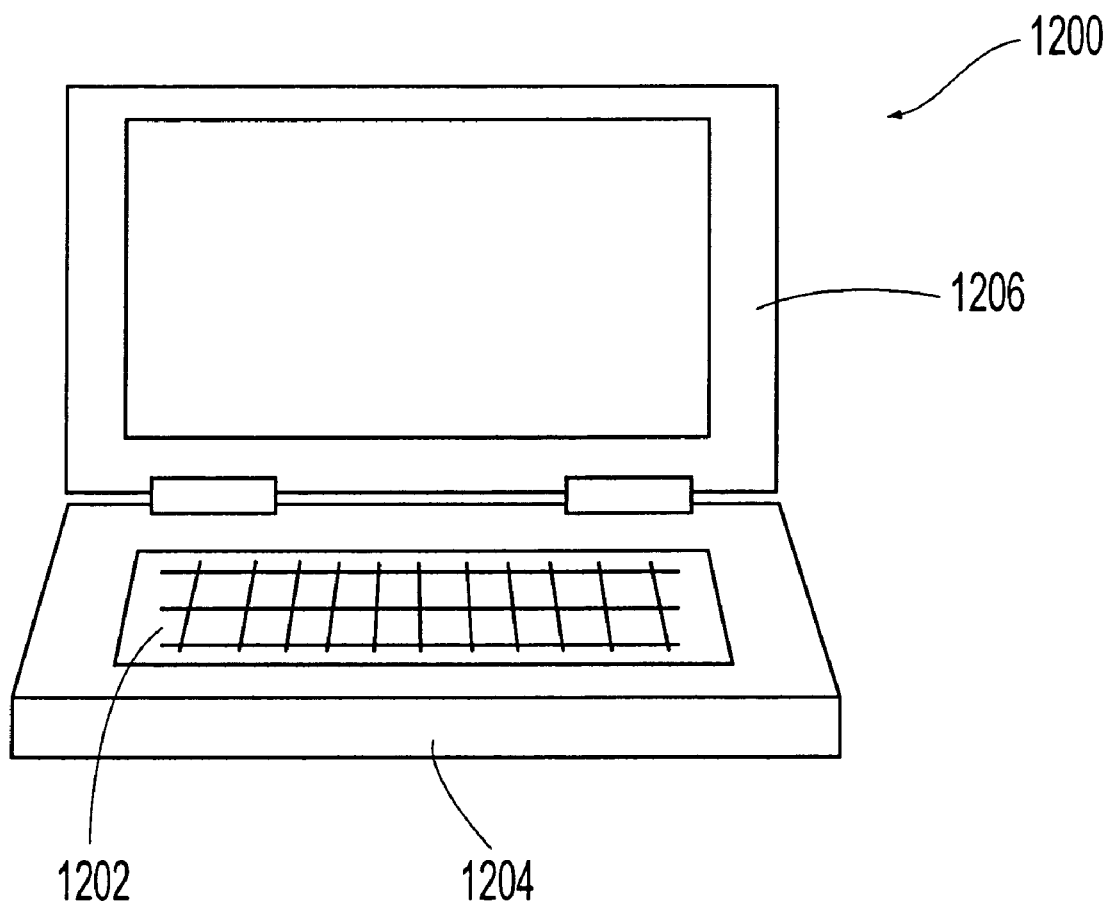
FIG. 17 shows an appearance of a computer using a liquid crystal panel in accordance with the present invention as a display device.

Examples of such electronic apparatuses include a liquid crystal projector as shown in FIG. 16, a personal computer (PC) for multimedia as shown in FIG. 17, an engineering workstation (EWS), a portable phone, a word processor, a television, a view finder, a monitor direct view type video tape recorder, an electronic notebook, an electronic portable calculator, a car navigation system, a POS terminal, and a device provided with a touch panel.

FIG. 16 is a schematic structural view of major sections of a projection display device. In the drawing, numeral 110 represents a light source; numerals 113 and 114 represent dichroic mirrors; numerals 115, 116, and 117 represent reflection mirrors; numerals 118, 119 and 120 represent relay lenses; numerals 122, 123, and 124 represent liquid crystal light valves using the liquid crystal devices of the present invention; numeral 125 represents a cross-dichroic prism; and numeral 126 represents a projection lens. The light source 110 includes a lamp 111, such as a metal halide lamp, and a reflector 112 for reflecting light from the lamp. The dichroic mirror 113 for reflecting blue light and green light transmits red light among a white light beam from the light source 110, and reflects the blue light and the green light. The transmitted red light is reflected by the reflection mirror 117 and is incident on the liquid crystal light valve 122 for red light. The green light among the reflected light from the dichroic mirror 113 is reflected by the dichroic mirror 114 for green light and is incident on the liquid crystal light valve 123 for green light. On the other hand, the blue light passes through the second dichroic mirror 114. A light guide 121 consisting of a relay lens system including the incident lens 118, the relay lens 119, and the emitting lens 120 is provided in order to prevent optical loss of the blue light having a long optical path. The blue light is incident on the liquid crystal light valve 124 for blue light via this guide. The three light beams modulated in the corresponding light valves are incident on the cross-dichroic prism 125. The prism consists of four bonded rectangular prism units, in which a dielectric multilayered film for reflecting red light and a dielectric multilayered film for reflecting blue light are orthogonally provided on the bonded faces. These dielectric multilayered films synthesize the three colors to form light beams which form a color image. The synthesized light is projected onto a screen 127 by a projection lens 126 as a projection optical system to display the enlarged image. These respective liquid crystal light valves use the liquid crystal devices of the present invention.

A personal computer 1200 shown in FIG. 17 has a main unit 1204 provided with a keyboard 1202, and a liquid crystal display screen 1206 using a liquid crystal device of the present invention.

In electronic apparatuses in accordance with the present invention, TFTs are composed of single-crystal silicon having larger transportability, in place of amorphous silicon or polycrystalline silicon used in conventional active matrix liquid crystal devices. Thus, the application time of a voltage to each pixel through a TFT is shortened, and the driving circuit can operate at a high frequency. The driving frequency for display can, therefore, be increased. Charge retention in pixels is improved due to significant reduction of OFF leakage compared to conventional TFTs, hence, a display device having superior display characteristics can be provided. Since the thermally conductive film 4 can dissipate heat and can provide light-shielding when light from the light source is intensified, malfunction of circuits can be more effectively prevented.

Industrial Applicability

The semiconductor device in accordance with the present invention can be used as a switching element constituting a peripheral circuit provided on a substrate in an electro-optical device such as a liquid crystal device, and as a semiconductor device constituting an electrical circuit in any apparatus other than the electro-optical device. Since the electro-optical device and the electronic apparatus in accordance with the present invention are formed of such a semiconductor device, they thus have high reliability and are relatively inexpensive due to high production yield.

What is claimed is:

1. A method for making a semiconductor device comprising:
   forming a thermally conductive film having a thermal conductivity higher than thermal conductivity of a supporting substrate on one surface of the supporting substrate;
   forming a first insulating film on the thermally conductive film; and
   adhering a single-crystal semiconductor film onto the first insulating film by heat treatment.

2. The method for making a semiconductor device according to claim 1, the supporting substrate comprising a light-transmissive material.

3. The method for making a semiconductor device according to claim 2, the light-transmissive material comprising glass.

4. The method for making a semiconductor device according to claim 3, the glass comprising a quartz glass.

5. The method for making a semiconductor device according to claim 1, the single-crystal semiconductor film comprising silicon.

6. The method for making a semiconductor device according to claim 1, adhering the single-crystal semiconductor film being performed by heat treatment in an oxygen-containing atmosphere.

7. The method for making a semiconductor device according to claim 1, the thermally conductive film comprising a light-shielding material.

8. The method for making a semiconductor device according to claim 1, the thermally conductive film comprising a high melting point metal.

9. The method for making a semiconductor device according to claim 1, the thermally conductive film comprising silicon.

10. The method for making a semiconductor device according to claim 1, further comprising forming a second insulating film between the thermally conductive film and the supporting substrate.

11. The method for making a semiconductor device according to claim 10, the second insulating film comprising at least one of a silicon oxide film, a silicon nitride film, and a tantalum oxide film.

12. The method for making a semiconductor device according to claim 1, further comprising planarizing the first insulating film after forming the first insulating film.

13. The method for making a semiconductor device according to claim 12, planarizing the first insulating film comprising a chemomechanical polishing treatment.

14. The method for making a semiconductor device according to claim 1, further comprising thinning the first insulating film after forming the first insulating film.

15. The method for making a semiconductor device according to claim 14, thinning the first insulating film comprising a chemomechanical polishing treatment.

16. The method for making a semiconductor device according to claim 14, the first insulating film being thinned until the first insulating film reaches a thickness of 300 nm or less.

17. The method for making a semiconductor device according to claim 1, the first insulating film comprising a silicon-containing alloy.

18. The method for making a semiconductor device according to claim 1, further comprising forming a third insulating film on a surface of the single-crystal semiconductor film prior to adhering the single-crystal semiconductor film onto the first insulating film.

19. The method for making a semiconductor device according to claim 18, the third insulating film being formed by oxidizing or nitriding the surface of the single-crystal semiconductor film.

20. A semiconductor device constituting at least a part of a peripheral circuit provided in a peripheral region of a supporting substrate, comprising:
    a thermally conductive film formed on one surface of the supporting substrate in at least the peripheral region and having a thermal conductivity higher than a thermal conductivity of the supporting substrate;
    a first insulating film formed on the thermally conductive film; and
    a single-crystal semiconductor film adhered onto the first insulating film as a current path of the peripheral circuit.

21. The semiconductor device according to claim 20, the thermally conductive film comprising a light-shielding material.

22. The semiconductor device according to claim 20, further comprising a single-crystal thin film transistor provided with a channel region, a source region, and a drain region in the single-crystal semiconductor film.

23. A method for making an electro-optical device comprising an electro-optical material held between a supporting substrate and an opposite substrate, a plurality of first switching elements arranged in a matrix corresponding to a pixel array in an image display region on the supporting substrate, and a plurality of second switching elements arranged in a peripheral region of the image display region and partly constituting a peripheral circuit, the method comprising:

forming a thermally conductive film having a thermal conductivity higher than a thermal conductivity of the supporting substrate in a region facing at least the second switching elements on one surface of the supporting substrate;

forming a first insulating film on the thermally conductive film; and adhering a single-crystal semiconductor film as current paths in the second switching elements on the first insulating film by heat treatment.

24. The method for making an electro-optical device according to claim 23, the thermally conductive film comprising a light-shielding material.

25. An electro-optical device comprising:

a supporting substrate;

an opposite substrate;

an electro-optical material disposed between the supporting substrate and the opposite substrate;

a plurality of first switching elements arranged in a matrix corresponding to a pixel array in an image display region on the supporting substrate;

a plurality of second switching elements arranged in a peripheral region of the image display region and partly constituting a peripheral circuit;

a thermally conductive film formed on one surface of the supporting substrate in at least the peripheral region and having a thermal conductivity higher than a thermal conductivity of the supporting substrate; and a first insulating film formed on the thermally conductive film, the second switching elements including a single-crystal semiconductor film as a current path adhered to the first insulating film.

26. The electro-optical device according to claim 25, the first switching elements comprising a single-crystal semiconductor film as a current path adhered to the first insulating film in the image display region.

27. The electro-optical device according to claim 25, the second switching elements comprising single-crystal thin film transistors provided with channel regions, source regions, and drain regions in the single-crystal semiconductor film.

28. The electro-optical device according to claim 25, the peripheral circuit comprising driving circuits.

29. The electro-optical device according to claim 25, the thermally conductive film comprising a light-shielding material.

30. The electro-optical device according to claim 25, the thermally conductive film comprising a conductive material and constituting a wiring.

31. The electro-optical device according to claim 25, the thermally conductive film comprising a conductive material and constituting a one-side electrode of a capacitor.

32. An electronic apparatus comprising the electro-optical device according to claim 25.

33. The electronic apparatus according to claim 32, further comprising a light source and a projection lens, the thermally conductive film comprising a light-shielding material, the electro-optical device modulating light from the light source, and the projection lens projecting the light modulated by the electro-optical device.

* * * * *